(12) United States Patent
Lee et al.

(10) Patent No.: US 8,223,283 B2
(45) Date of Patent: Jul. 17, 2012

(54) DISPLAY SUBSTRATE, METHOD OF MANUFACTURING THE DISPLAY SUBSTRATE AND DISPLAY APPARATUS HAVING THE DISPLAY SUBSTRATE

(75) Inventors: Bong-Jun Lee, Seoul (KR); Byeong-Jae Ahn, Suwon-si (KR); Yeo-Geon Yoon, Seoul (KR); Hong-Woo Lee, Cheonan-si (KR); Hyuk-Jin Kim, Cheonan-si (KR); Jong-Oh Kim, Cheonan-si (KR); Gyu-Tae Kim, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 856 days.

(21) Appl. No.: 12/332,213

(22) Filed: Dec. 10, 2008

(65) Prior Publication Data

US 2009/0167733 A1   Jul. 2, 2009

(30) Foreign Application Priority Data

Dec. 28, 2007   (KR) .................. 10-2007-0140646

(51) Int. Cl.
*G02F 1/1343*   (2006.01)

(52) U.S. Cl. ............................... 349/39; 349/38; 349/139

(58) Field of Classification Search ................ 349/43, 349/139, 147
See application file for complete search history.

(56) References Cited

U.S. PATENT DOCUMENTS

| 6,633,359 B1 * | 10/2003 | Zhang et al. ................. 349/141 |
| 2005/0162600 A1 * | 7/2005 | Rho et al. ..................... 349/139 |

* cited by examiner

*Primary Examiner* — Nathanael R Briggs
(74) *Attorney, Agent, or Firm* — Innovation Counsel LLP

(57) ABSTRACT

A display substrate includes a base substrate, a first line, a second line, a bridge line, a thin-film transistor (TFT), a storage line, and a pixel electrode. The first line extends in a first direction on the base substrate. The second line extends in a second direction on the base substrate and is divided into two portions with respect to the first line. The bridge line makes contact with the two portions of the second line in first and second bridge contact regions. The TFT includes a source electrode making contact with one of the first and second lines in a data contact region. The storage line is formed on the one of the first and second lines. The pixel electrode is formed on the storage line and is electrically connected to the TFT. The display substrate reduces formation of parasitic capacitance between pixel electrode and data line.

19 Claims, 20 Drawing Sheets

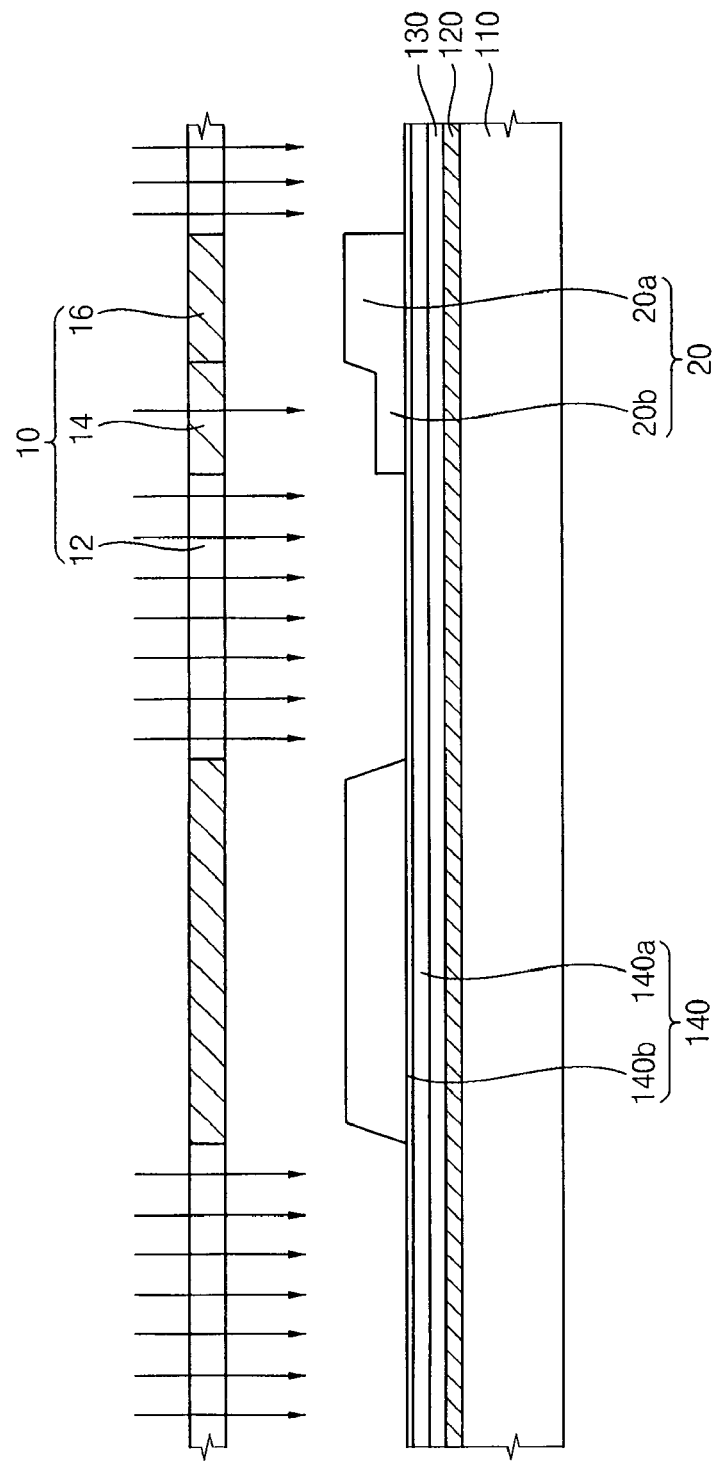

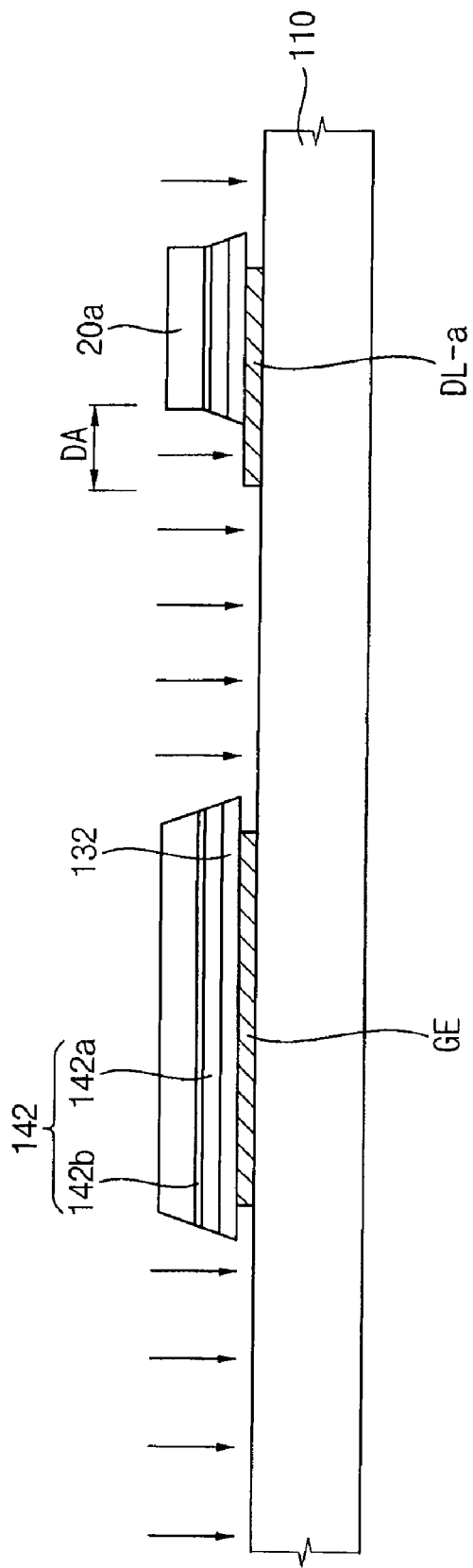

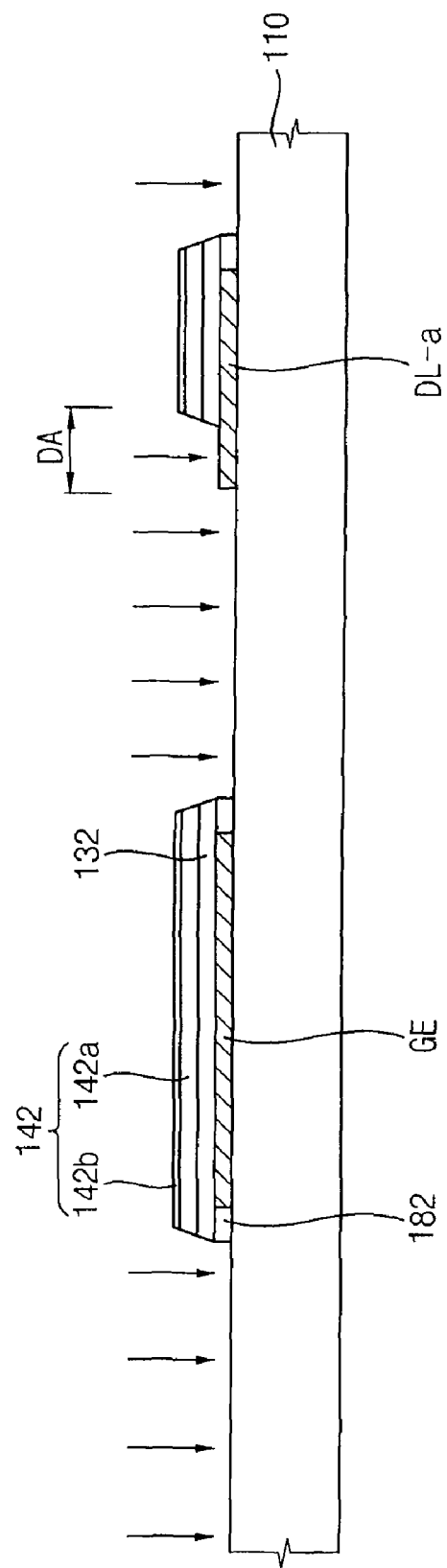

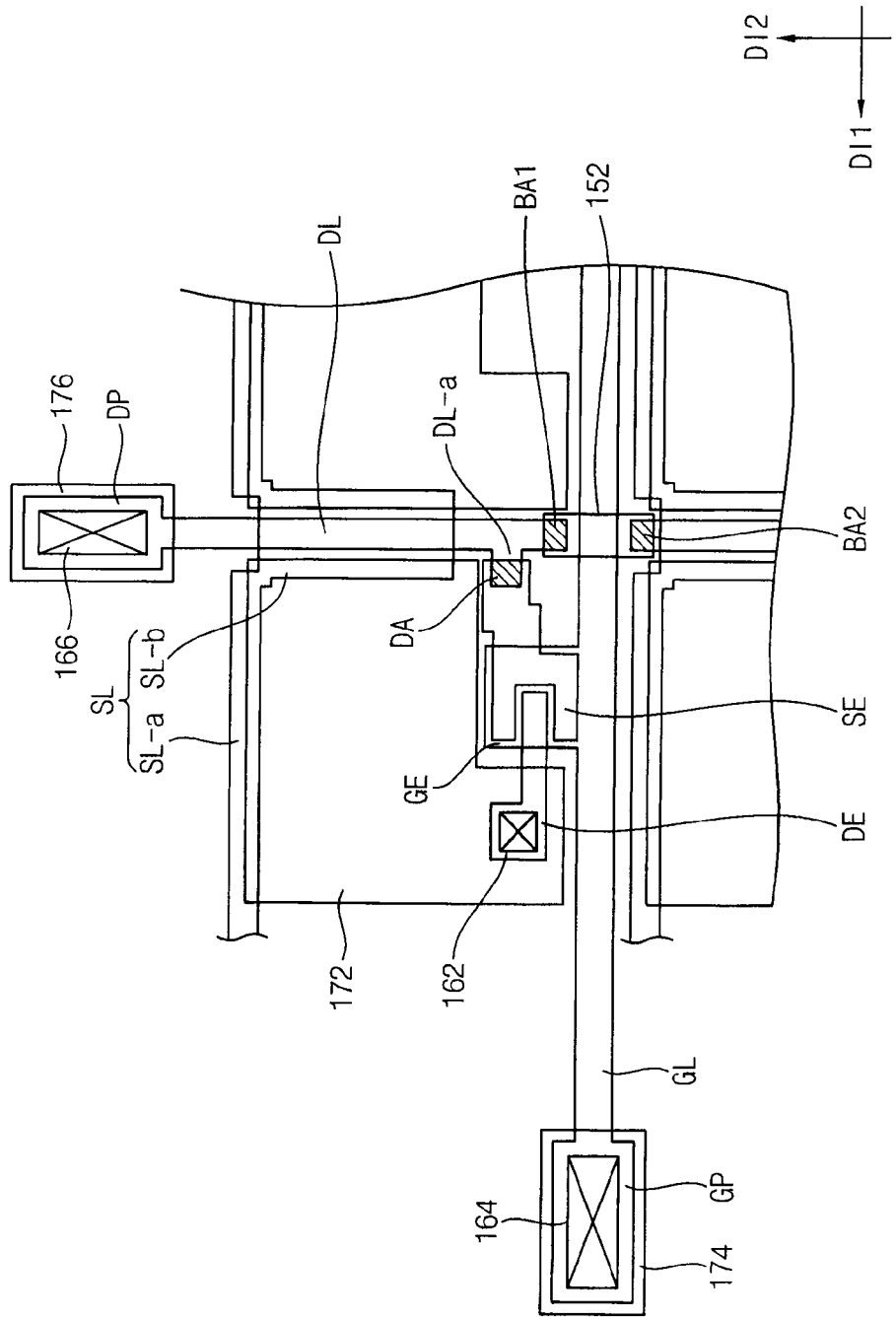

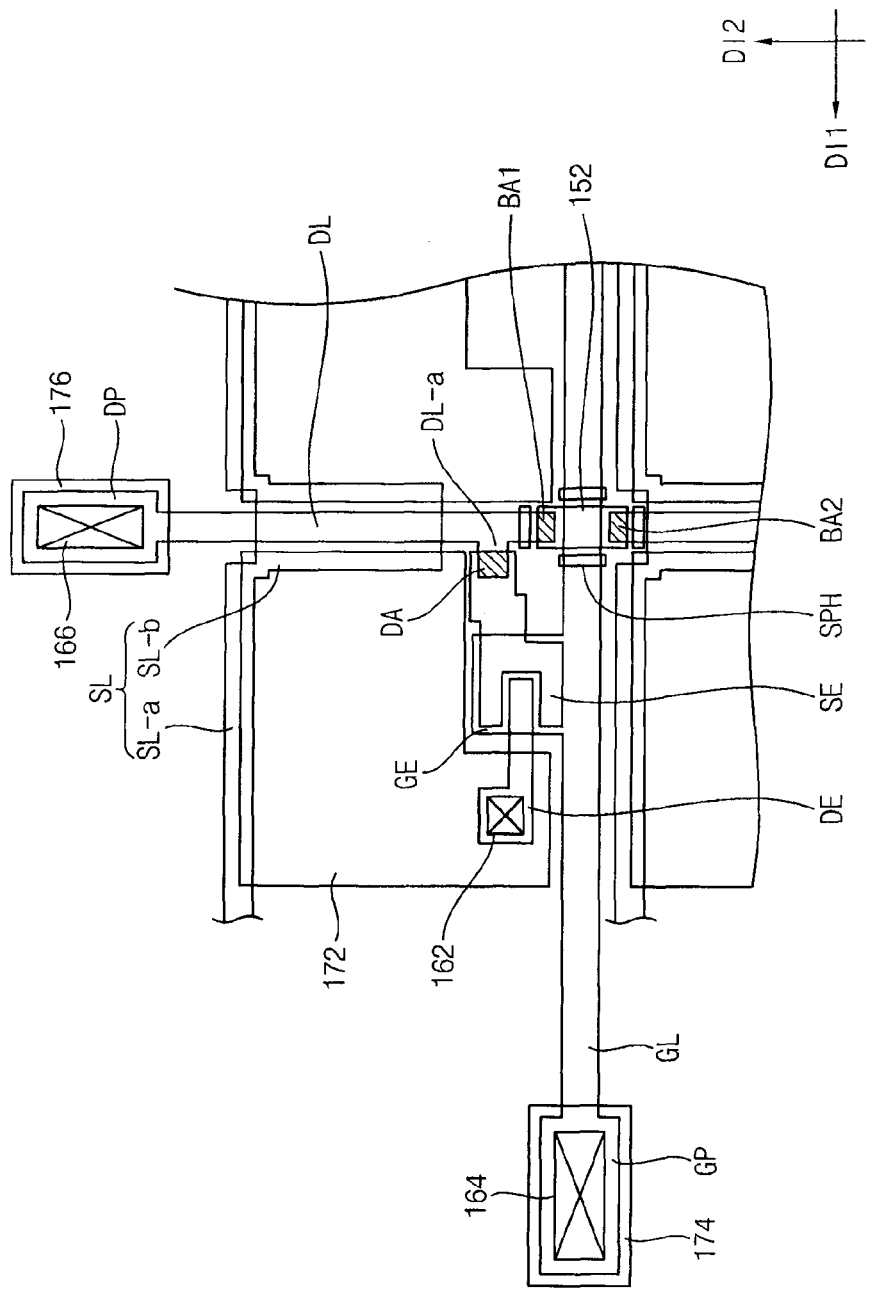

DISPLAY SUBSTRATE, METHOD OF MANUFACTURING THE DISPLAY SUBSTRATE AND DISPLAY APPARATUS HAVING THE DISPLAY SUBSTRATE

CROSS-REFERENCE TO RELATED APPLICATIONS

This application claims priority under 35 U.S.C. §119 to Korean Patent Application No. 2007-140646, filed on Dec. 28, 2007 in the Korean Intellectual Property Office (KIPO), the content of which is incorporated herein by reference in its entirety.

BACKGROUND OF THE INVENTION

1. Field of the Invention

Embodiments of the present invention relate to a display substrate, a method of manufacturing the display substrate and a display apparatus having the display substrate. More particularly, embodiments of the present invention relate to a display substrate for displaying an image, a method of manufacturing the display substrate and a display apparatus having the display substrate.

2. Description of the Related Art

A liquid crystal display (LCD) apparatus includes a display panel and a backlight assembly. The display panel displays an image using light transmissivity of liquid crystal. The backlight assembly is disposed under the display panel and provides the display with light.

The display panel includes a first substrate, a second substrate opposite to the first substrate and a liquid crystal layer disposed between the first and second substrates. The first substrate includes a gate line, a data line, a thin-film transistor (TFT), and a pixel electrode. The gate line extends in a first direction. The data line extends in a second direction different from the first direction. The TFT is electrically connected to the gate line and the data line. The pixel electrode is electrically connected to the TFT. The pixel electrode is formed in a unit pixel defined by the gate line and the data line.

When the pixel electrode is adjacent to the gate line or the data line, a large parasitic capacitance may form between the pixel electrode and the gate line or between the pixel electrode and the data line. The large parasitic capacitance may affect a pixel voltage applied to the pixel electrode, so that display quality may be decreased.

Alternatively, when the pixel electrode is excessively spaced apart from the gate line or the data line for reducing the parasitic capacitance, the aperture ratio of the LCD apparatus may be decreased.

SUMMARY OF THE INVENTION

Embodiments of the present invention provide a display substrate capable of reducing a parasitic capacitance and increasing an aperture ratio.

Embodiments of the present invention also provide a method of manufacturing the display substrate.

Embodiments of the present invention further provide a display apparatus having the display substrate.

According to one aspect of the present invention, there is provided a display substrate. The display substrate includes a base substrate, a first line, a second line, a bridge line, a thin-film transistor (TFT), a storage line, and a pixel electrode.

The first line is formed on the base substrate. The first line extends in a first direction. The second line is formed on the base substrate. The second line extends in a second direction different from the first direction. The second line is divided into two portions with respect to the first line. The bridge line makes contact with the two portions of the second line in a first bridge contact region and a second bridge contact region to electrically connect the two portions of the second line to each other. The TFT is formed from a different layer from the first and second lines. The TFT includes a source electrode making contact with one of the first and second lines in a data contact region. The storage line is formed on the one of the first and second lines making contact with the source electrode and overlaps the one of the first and second lines making contact with the source electrode. The pixel electrode is formed on the storage line to overlap with the storage line. The pixel electrode is electrically connected to the TFT.

The TFT may further include a gate electrode and a drain electrode. The gate electrode may be electrically connected to one of the first and second lines. The drain electrode may be separated from the source electrode and electrically connected to the pixel electrode.

The source electrode, the drain electrode, the storage line, and the bridge line may be formed by patterning an upper metal layer. The first line, the second line and the gate electrode may be formed by patterning a lower metal layer.

The display substrate may further include a line insulation layer. The line insulation layer is formed between the lower metal layer and the upper metal layer. The line insulation layer may expose a portion of one of the first and the second line in the data contact region and portions of the second line in the first and second contact regions.

The display substrate may further include a line insulation layer and a semiconductor pattern. The line insulation layer and the semiconductor pattern may be formed on a lower metal pattern. The line insulation layer and the semiconductor pattern may expose a portion of one of the first and second lines in the data contact region and portions of the second line in the first and second bridge contact regions.

The display substrate may further include a space-filling insulation pattern. The space-filling insulation pattern is formed in a space between the line insulation pattern and the base substrate. The space may be adjacent to the lower metal pattern.

Separation holes may be formed through the semiconductor pattern adjacent to ends of the bridge line with respect to the first direction and ends of the bridge line with respect to the second direction.

One of the first and second lines may be a data line and a remainder of the first and second lines may be a gate line.

The storage line may include a horizontal storage part and a vertical horizontal part. The horizontal storage part overlaps the pixel electrode and is substantially parallel to the gate line. The vertical storage part extends from the horizontal storage part in the first direction and covers the data line. The vertical storage part may be wider than the data line.

The display substrate may further include a line insulation pattern and a semiconductor pattern. The line insulation pattern and the semiconductor pattern are formed on top of each other between the data line and the vertical storage part. The vertical storage part may be wider than the semiconductor pattern to cover the semiconductor pattern.

The display substrate may further include a transparent connection electrode. The transparent connection electrode may electrically connect two divided portions of the horizontal storage part with each other. The transparent connection electrode may be formed from a transparent metal layer from which the pixel electrode is formed.

The horizontal storage part may be formed from a lower metal layer from which the gate line and the data line are formed. The vertical storage part may be formed on the horizontal storage part to make contact with the horizontal storage part in a storage contact region.

According to one aspect of the present invention, there is provided a method of manufacturing a display substrate. In the method, a lower metal pattern is formed in the base substrate. The lower metal pattern may include a first line extending in a first direction, a second line extending in a second direction different from the first direction. The second line is divided into two portions with respect to the first line and a gate electrode connected to one of the first and second lines. Then, an upper metal pattern is formed on the lower metal pattern. The upper metal pattern may include a source electrode making contact with one of the first and second lines, a drain electrode separated from the source electrode, a storage line overlapping with the one of the first and second lines making contact with the source electrode, and a bridge line making contact with the two portions of the second line. Then, a transparent metal pattern is formed on the upper metal pattern. The transparent metal pattern may include a pixel electrode electrically connected to the drain electrode.

One of the first and second lines may be a data line and a remainder of the first and second lines may be a gate line.

For forming the lower metal pattern, a lower metal layer may be formed on the base substrate. Then, a line insulation layer and a semiconductor layer may be formed on the lower metal layer. The semiconductor layer is formed on the line insulation layer. Then, a photoresist pattern may be formed on the semiconductor layer. The photoresist pattern may include a first photo pattern part and a second photo pattern part that is thinner than the first photo pattern part. Then, the semiconductor layer and the line insulation layer may be patterned using the photoresist pattern to form a semiconductor pattern and a line insulation pattern. Then, the lower metal layer may be patterned using the semiconductor pattern and the line insulation pattern to form a lower metal pattern. Then, the photoresist pattern may be reduced by the thickness of the second photo pattern part, leaving a portion of the first photo pattern part and none of the second photo pattern part. Then, a portion of the lower metal pattern that was covered by the second pattern part may be exposed to light.

For patterning the lower metal layer, a sacrificial insulation layer may be formed on the base substrate to cover the line insulation pattern and the semiconductor pattern. The sacrificial insulation layer may be formed between the line insulation pattern and the base substrate. Then, a portion of the sacrificial insulation layer may be removed to form a space-filling insulation pattern. The space-filling insulation pattern may fill a space between the line insulation pattern and the base substrate.

For forming the transparent metal pattern, a passivation layer may be formed on the upper metal pattern. Then, a pixel contact hole corresponding to the drain electrode and semiconductor patterning holes corresponding to ends of the bridge line with respect to the first direction and ends of the bridge line with respect to the second direction may be formed through the passivation layer. Then, a portion of the semiconductor pattern may be removed using the semiconductor patterning holes to form separation holes through the semiconductor pattern. Then, the transparent metal pattern may be formed on the passivation layer. The transparent metal pattern may include the pixel electrode electrically connected to the drain electrode through the pixel contact hole.

For forming the lower metal pattern, the lower metal pattern may be formed on the base substrate. Then, a line insulation layer covering the lower metal pattern may be formed on the base substrate. Then, a semiconductor layer may be formed on the line insulation layer. Then, a photoresist pattern may be formed on the semiconductor layer. The photoresist pattern may include a first photo pattern part, a second photo pattern part having a thickness smaller than the thickness of the first photo pattern part, and a photo hole. Then, a portion of the semiconductor layer and a portion of the line insulation layer may be removed using the photo hole of the photoresist pattern to expose a portion of the lower metal pattern. Then, the thickness of the photoresist pattern may be reduced to remove the second photo pattern part from the photoresist pattern. Then, a portion of the semiconductor layer may be removed using the photoresist pattern having the reduced thickness to form a semiconductor pattern on the gate electrode of the lower metal pattern.

According to one aspect of the present invention, there is provided a display apparatus. The display apparatus includes a first substrate, a second substrate opposite to the first substrate and a liquid crystal layer disposed between the first and second substrates.

The first substrate may include a base substrate, a first line, a second line, a bridge line, a TFT, a storage line, a pixel electrode.

The first line may be formed on the base substrate and extend in a first direction. The second line may be formed on the base substrate. The second line may extend in a second direction different from the first direction and be divided into two portions with respect to the first line. The bridge line may make contact with the two portions of the second line in a first bridge contact region and a second bridge contact region to electrically connect the two portions of the second line to each other. The TFT may be formed from a different layer from the first and second lines. The TFT may include a source electrode making contact with one of the first and second lines in a data contact region. The storage line may be formed on the one of the first and second lines making contact with the source electrode and overlap the one of the first and second lines making contact with the source electrode. The pixel electrode may be formed on the storage line and overlap the storage line. The pixel electrode may be electrically connected to the TFT.

According to the embodiments of the present invention, a parasitic capacitance formed between a pixel electrode and a data line may be prevented, regardless of the position of the pixel electrode. Therefore, a distance between two adjacent pixel electrodes may be reduced so that the aperture ratio of a display apparatus may be increased, because the data line is disposed under a vertical storage part to be covered by the vertical storage part.

BRIEF DESCRIPTION OF THE DRAWINGS

The above and other features and advantages of the present invention will become readily apparent by reference to the following detailed description when considered in conjunction with the accompanying drawings wherein:

FIGS. 7A to 7F are cross-sectional views illustrating a method of manufacturing the first substrate illustrated in FIG. 5;

FIG. 8 is an enlarged plan view illustrating a portion of a first substrate employed in a display apparatus in accordance with Embodiment 3 of the present invention;

FIG. 9 is an enlarged plan view illustrating a portion of a first substrate employed in a display apparatus in accordance with Embodiment 4 of the present invention;

DESCRIPTION OF THE EMBODIMENTS

Figure 1:
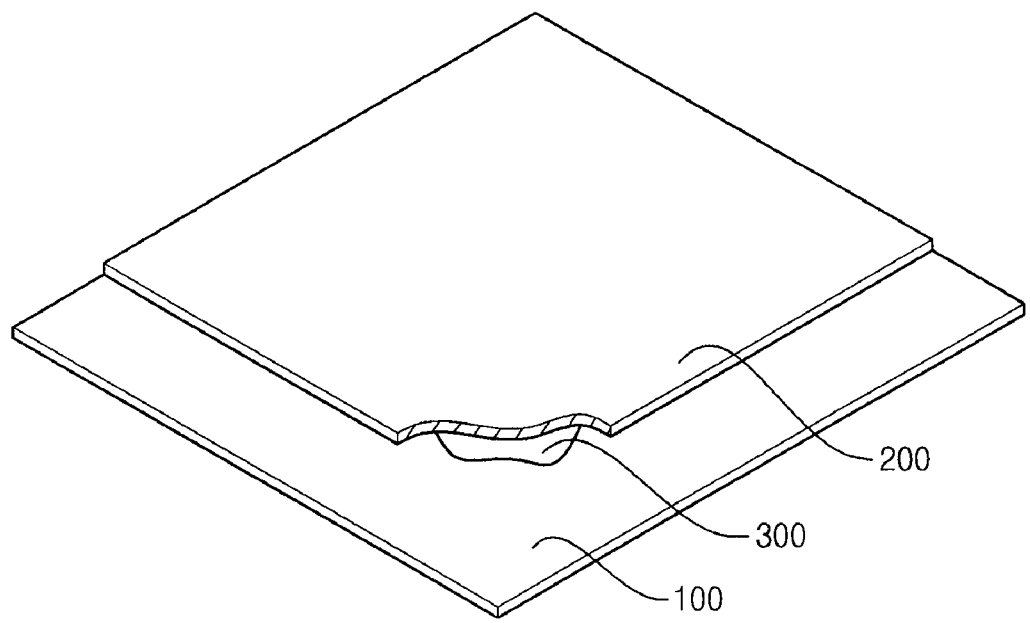
FIG. 1 is a perspective view illustrating a display apparatus in accordance with Embodiment 1 of the present invention.

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view illustrating a display apparatus in accordance with Embodiment 1 of the present invention.

Referring to FIG. 1, a display apparatus includes a first substrate 100, a second substrate 200 and a liquid crystal layer 300. The display apparatus displays an image using light.

The first substrate 100 may include a plurality of unit pixels arranged in a matrix form.

The second substrate 200 may be opposite to the first substrate 100. The second substrate 200 may include a plurality of color filters corresponding to the unit pixels and a common electrode formed on the entire surface of the second substrate 200 facing the first substrate 100. The color filters may include a red color filter, a green color filter and a blue color filter. In another embodiment of the present invention, the color filters may be formed on the first substrate 100.

The liquid crystal layer 300 is disposed between the first substrate 100 and the second substrate 200. The liquid crystal layer 300 includes liquid crystal molecules. Arrangements of the liquid crystal molecules may be changed by an electric field formed between pixel electrodes of the first substrate 100 and the common electrode of the second substrate 200. As the arrangements of the liquid crystal molecules are changed, the amount of light passing through the liquid crystal layer 300 may be changed, so that the display apparatus may display the image.

The display apparatus may further include a backlight assembly (not shown). The backlight assembly may be disposed under the first substrate 100 and provide light to the first substrate 100.

Figure 2:
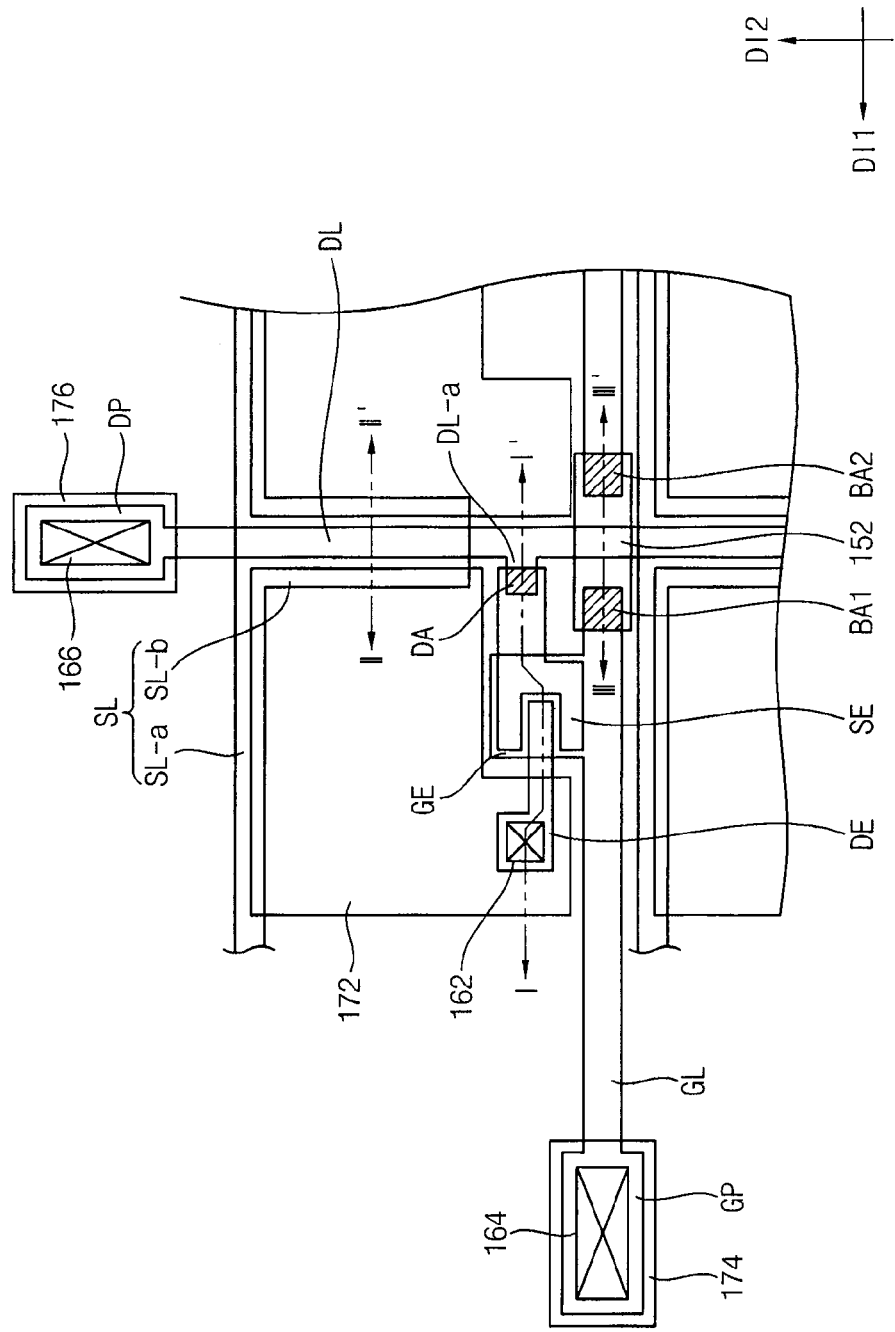
FIG. 2 is an enlarged plan view illustrating a first substrate employed in the display apparatus illustrated in FIG. 1.
Figure 3A:
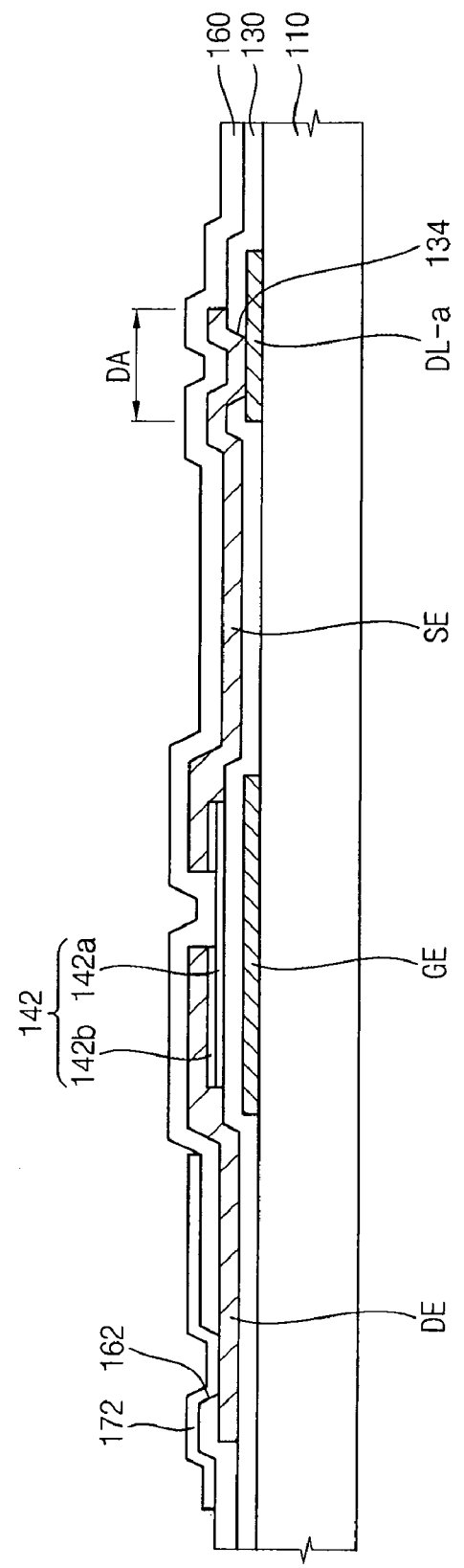
FIG. 3A is a cross-sectional view taken along a line I-I' shown in FIG. 2.
Figure 3B:
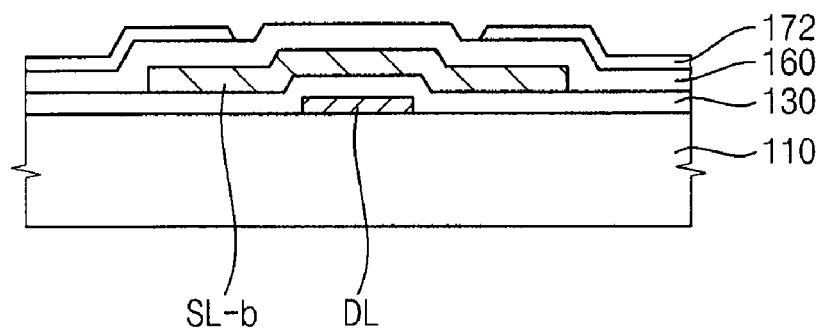
FIG. 3B is a cross-sectional view taken along a line II-II' shown in FIG. 2.
Figure 3C:
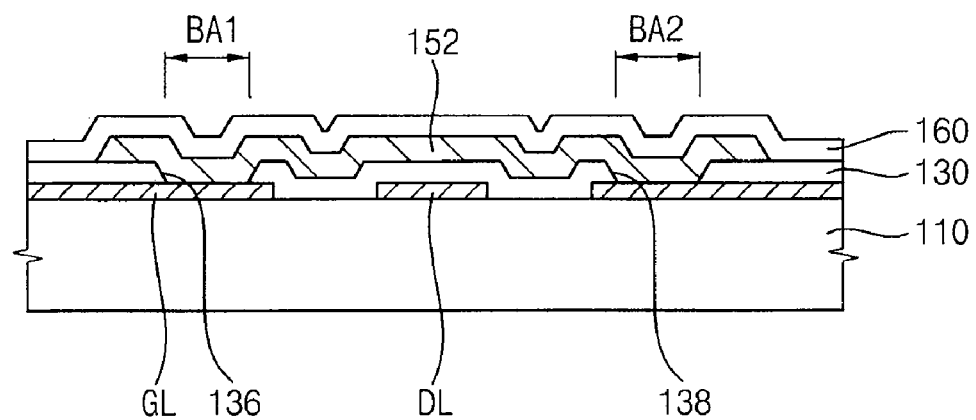
FIG. 3C is a cross-sectional view taken along a line III-III' shown in FIG. 2.

FIG. 2 is an enlarged plan view illustrating a first substrate employed in the display apparatus illustrated in FIG. 1. FIG. 3A is a cross-sectional view taken along a line I-I' shown in FIG. 2. FIG. 3B is a cross-sectional view taken along a line II-II' shown in FIG. 2. FIG. 3C is a cross-sectional view taken along a line III-III' shown in FIG. 2.

Referring to FIG. 2 and FIGS. 3A to 3C, the first substrate 100 includes a base substrate 110, gate lines GL, data lines DL, a line insulation layer 130, thin-film transistors (TFTs), storage lines SL, bridge lines 152, a passivation layer 160, and pixel electrodes 172. Each of the TFTs may include a gate electrode GE, a semiconductor pattern 142, a source electrode SE, and a drain electrode DE.

The base substrate 110 may have a plate shape. The base substrate 110 may include a transparent material. For example, the base substrate 110 may include at least one of glass, quartz, synthetic resin, etc. The base substrate 110 may include a display region displaying an image and a peripheral region surrounding the display region. The unit pixels arranged in the matrix shape may be disposed in the display region.

The gate lines GL are formed on the base substrate 110. The gate lines GL extend in a first direction DI1 and are arranged parallel to one another along a second direction different from the first direction DI2. For example, the second direction DI2 may be substantially perpendicular to the first direction DI1.

The data lines DL are also formed on the base substrate 110. The data lines DL are separated from the gate lines GL. The data lines DL extend in the second direction DI2 and are arranged parallel to one another along the first direction DI1.

The gate lines GL are divided into two portions by each of the data lines DL. For example, each of the gate lines GL is divided into two portions separated from each other with respect to one data line DL.

Each data line DL may include data contact parts DL-a formed in unit pixels. The data contact part DL-a may extend from and electrically connect to a data line DL. For example, the data contact part DL-a may extend from the data line DL in the first direction DI1 to be disposed in the unit pixel.

An end of each gate line GL is connected to a gate pad GP and an end of each data line DL is connected to a data pad DP. The gate pad GP and the data pad DP are formed in the peripheral region of the base substrate 110.

The gate electrode GE of the TFT is electrically connected to the gate line GL. For example, the gate electrode GE may be formed on the base substrate 110 and extend from the gate line GL in the second direction to be disposed in the unit pixel.

The line insulation layer 130 is formed on the base substrate 110 to cover the gate lines GL, the data lines DL, the gate pads GP, the data pads DP, the gate electrodes GE, and the data contact parts DL-a.

The line insulation layer 130 includes data contact holes 134 corresponding to data contact regions DA. Each data contact hole 134 exposes a portion of the data line DL. For example, each data contact hole 134 may expose the data contact part DL-a.

The line insulation layer 130 may further include a first bridge contact hole 136 and a second bridge contact hole 138 respectively corresponding to a first bridge contact region BA1 and a second bridge contact region BA2. The first and second bridge contact holes 136 and 138 may expose a portion of the gate line GL.

The semiconductor pattern 142 of the TFT is formed on the line insulation layer 130 to be disposed on the gate electrode GE. The semiconductor pattern 142 may include an active pattern 142a and an ohmic contact pattern 142b.

The active pattern 142a is formed on the line insulation layer 130 to overlap with the gate electrode GE. For example, the active pattern 142a may include amorphous silicon or microcrystalline silicon. The ohmic contact pattern 142b is formed on the active pattern 142a and have two portions separated from each other. For example, the ohmic contact pattern 142b may include amorphous silicon doped with ions at a high concentration or microcrystalline silicon doped with ions at a high concentration.

The source electrode SE and the drain electrode DE of the TFT are formed on the line insulation layer 130. The source electrode SE is formed in the unit pixel. A portion of the source electrode SE is formed on the semiconductor pattern 142. The drain electrode DE is separated from the source electrode SE and formed in the unit pixel. A portion of the drain electrode DE is formed on the semiconductor pattern 142. One of the two portions of the ohmic contact pattern 142b is disposed between the source electrode SE and the active pattern 142a and the other of the two portions of the ohmic contact pattern 142b is disposed between the drain electrode DE and the active pattern 142a.

The source electrode SE overlaps with a portion of the data line DL and makes direct contact with the data line DL in the data contact region DA. For example, the source electrode SE may make direct contact with the data contact part DL-a through the data contact hole 134 formed through the line insulation layer 130.

Each of the storage lines SL may include a horizontal storage part SL-a and a vertical storage part SL-b. The horizontal storage part SL-a is formed on the line insulation layer 130 and extends in the first direction DI1. The vertical storage part SL-b extends from the horizontal storage part SL-a in the second direction DI2 to cover the data line DL.

The vertical storage part SL-b may be wider than the data line DL. Thus, when viewed in a direction substantially perpendicular to a longitudinal direction of the data line DL as shown in FIG. 3B, the vertical storage part SL-b may entirely cover the data line DL. For example, the data line DL may extend along a central portion of the width of the vertical storage part SL-b.

The bridge lines 152 are formed on the line insulation layer 130. Each of the bridge lines 152 electrically connects the two separated portions of the gate line GL with each other. The bridge line 152 may cross the data line DL and make electrical contact with the two portions of the gate line GL through the first and second bridge contact holes 136 and 138, respectively.

The passivation layer 160 is formed on the line insulation layer 130 and covers the source electrodes SE, the drain electrodes DE, the storage lines SL, and the bridge lines 152.

The passivation layer 160 includes pixel contact holes 162 to expose drain electrodes DE. The passivation layer 160 may further include gate pad contact holes 164 to expose the gate pads GP and data pad contact holes 166 to expose the data pads DP.

The pixel electrodes 172 include a transparent conductive material. The pixel electrodes 172 are formed in the unit pixels and disposed on the passivation layer 160. The pixel electrodes 172 are electrically connected to the drain electrodes DE, respectively. For example, the pixel electrodes 172 may be electrically connected to the drain electrodes DE through the pixel contact holes 162 formed through the passivation layer 160.

Each of the pixel electrodes 172 is formed in the unit pixel to partially overlap the horizontal storage part SL-a and the vertical storage part SL-b. In embodiments of the present invention, because the data line DL is disposed under the vertical storage part SL-b to be covered by the vertical storage part SL-b, formation of parasitic capacitance between the pixel electrode 172 and the data line DL may be prevented, regardless of the position of the pixel electrode 172. Therefore, a distance between two adjacent pixel electrodes 172 along the first direction DI1 may be reduced so that the aperture ratio of the display apparatus may be increased.

A gate transparent pad pattern 174 and a data transparent pad pattern 176 may be formed on the passivation layer 160. The gate transparent pad pattern 174 is electrically connected to the gate pad GP through the gate pad contact hole 164 and the data transparent pad pattern 176 is electrically connected to the data pad DP through the data pad contact hole 166.

Hereinafter, a method of manufacturing the first substrate illustrated in FIG. 2 will be described.

Figure 4A:
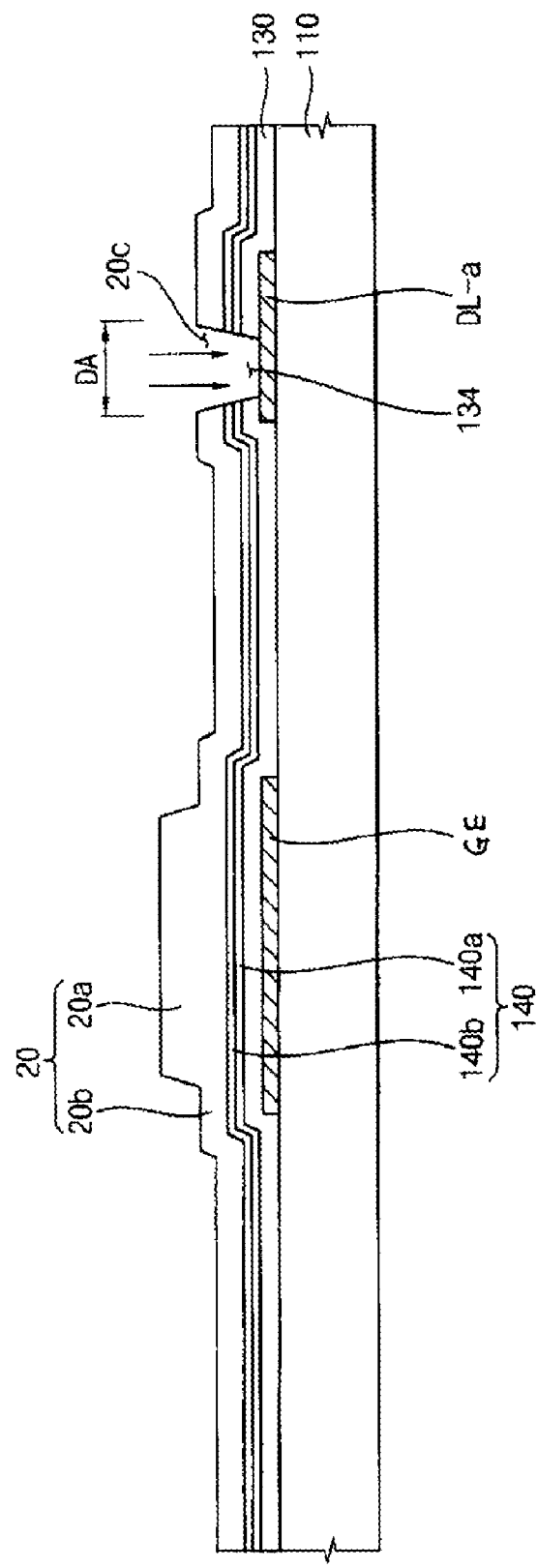
FIGS. 4A to 4C are cross-sectional views illustrating a method of manufacturing the first substrate illustrated in FIG. 2.
Figure 4B:
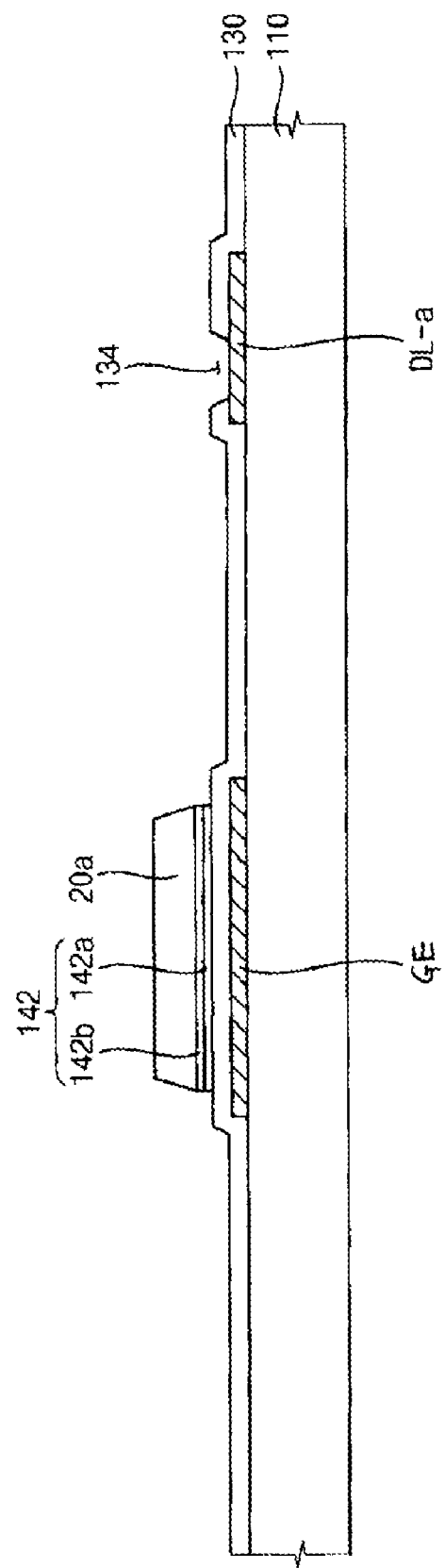
Figure 4C:
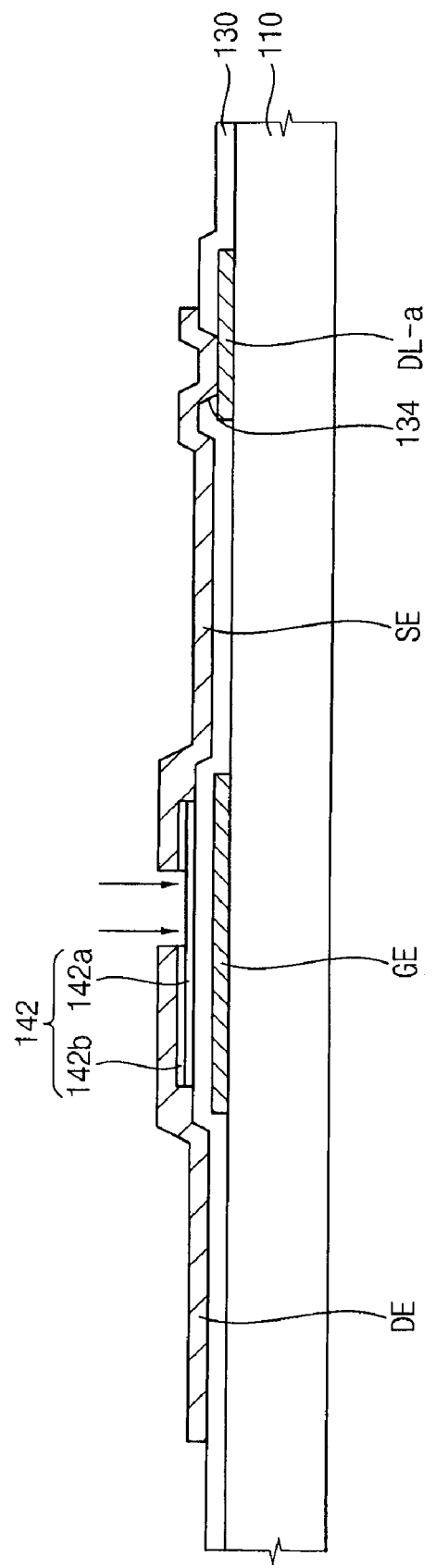

FIGS. 4A to 4C are cross-sectional views illustrating a method of manufacturing the first substrate illustrated in FIG. 2.

Referring to FIG. 4A, a lower metal layer is formed on the base substrate 110, and then the lower metal layer is patterned to form a lower metal pattern.

The lower metal pattern includes the gate line GL, the data line DL and the gate electrode GE. The lower metal pattern may further include the gate pad GP and the data pad DP.

The line insulation layer 130 is formed on the base substrate 110 to cover the lower metal pattern. Then, a semiconductor layer 130 is formed on the line insulation layer 130. The semiconductor layer 140 may include an active layer 140a and an ohmic contact layer 140b.

A photoresist pattern 20 is formed on the semiconductor layer 140. The photoresist pattern 20 includes a first photo pattern part 20a, a second photo pattern part 20b that is thinner than the first photo pattern part 20a, and a photo hole 20c formed through the photoresist pattern 20. For example, the photo hole 20c may correspond to the data contact region DA, the first bridge contact region BA1, and the second bridge contact region BA2.

A portion of the semiconductor layer 140 and a portion of the line insulation layer 130 are removed using the photo hole 20c to expose a portion of the lower metal pattern. For example, the portion of the insulation layer 130 may be removed to form the data contact holes 134 and the first and second bridge contact holes 136 and 138.

Referring to FIG. 4B, the thickness of the photoresist pattern 20 is reduced to remove the second photo pattern part 20b from the photoresist pattern 20. When the thickness of the photoresist pattern 20 is reduced, the second photo pattern part 20b is removed from the photoresist pattern 20 and the first photo pattern part 20a having a reduced thickness remains.

A portion of the semiconductor layer 140 is removed using the first photo pattern part 20a having the reduced thickness to form the semiconductor pattern 142. For example, the semiconductor pattern 142 may be formed on the gate electrode GE of the lower metal pattern.

Referring to FIG. 4C, after the photoresist pattern 20 is entirely removed, an upper metal layer is formed on the line insulation layer 130 to cover the semiconductor pattern 142, and then the upper metal layer is patterned to form an upper metal pattern. The upper metal pattern may include the source electrode SE, the drain electrode DE, the storage line SL, and the bridge line 152.

For example, the source electrode SE may make direct contact with a portion of the data line DL, such as the data contact part DL-a, in the data contact region DA and the bridge line 152 may make direct contact with the two portions of the gate line GL separated from each other by the data line DL.

A portion of the semiconductor pattern 142 is removed using the upper metal pattern. For example, a portion of the ohmic contact pattern 142b of the semiconductor pattern 142 may be removed using the source electrode SE and the drain electrode DE so that the ohmic contact pattern 142b may be divided into two portions separated from each other.

Referring to FIGS. 2 to 3C, after the passivation layer 160 is formed on the line insulation layer 130 to cover the upper metal pattern, a portion of the passivation layer 160 is etched to form the pixel contact hole 162 passing through the passivation layer 160. The pixel contact hole 162 corresponds to the drain electrode DE.

Additionally, the gate pad contact hole 164 corresponding to the gate pad GP and the data pad contact hole 166 corresponding to the data pad DP may be further formed through the passivation layer 160.

A transparent metal layer is formed on the passivation layer 160. The transparent metal layer is patterned to form a transparent metal pattern. The transparent metal pattern may include the pixel electrode 172. The transparent metal pattern may further include the gate transparent pad pattern 174 making contact with the gate pad GP and the data transparent pad pattern 176 making contact with the data pad DP.

The pixel electrode 172 may be electrically connected to the drain electrode DE through the pixel contact hole SPH formed through the passivation layer 160.

Figure 5:
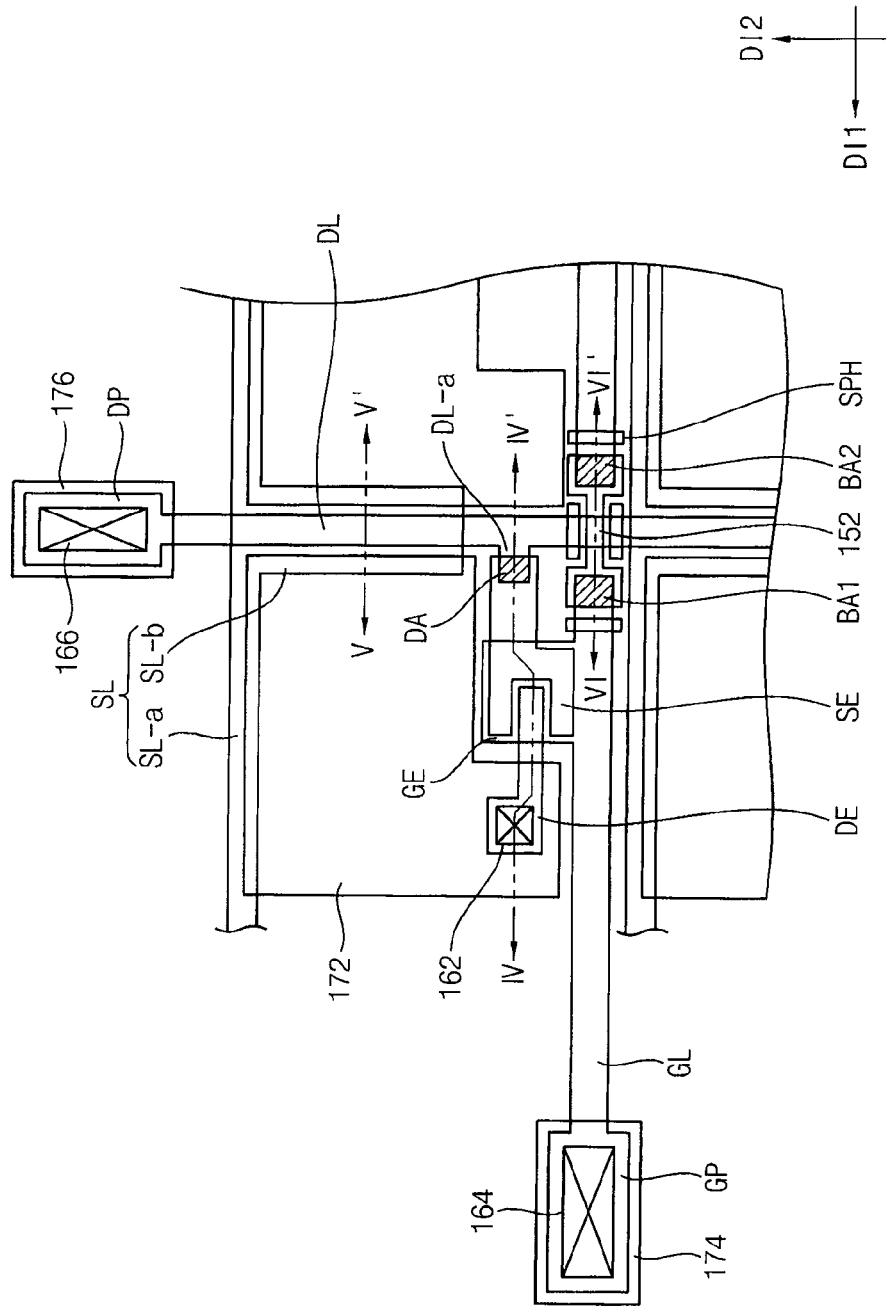
FIG. 5 is an enlarged plan view a first substrate employed in a display apparatus in accordance with Embodiment 2 of the present invention.
Figure 6A:
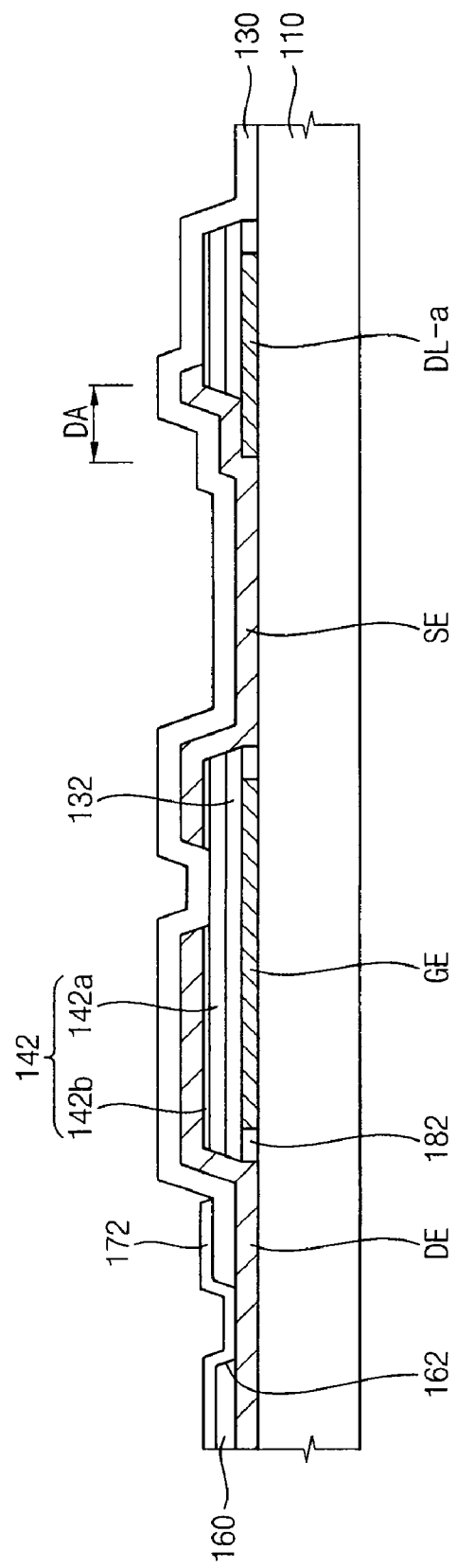
FIG. 6A is a cross-sectional view taken along a line IV-IV' shown in FIG. 5.
Figure 6B:
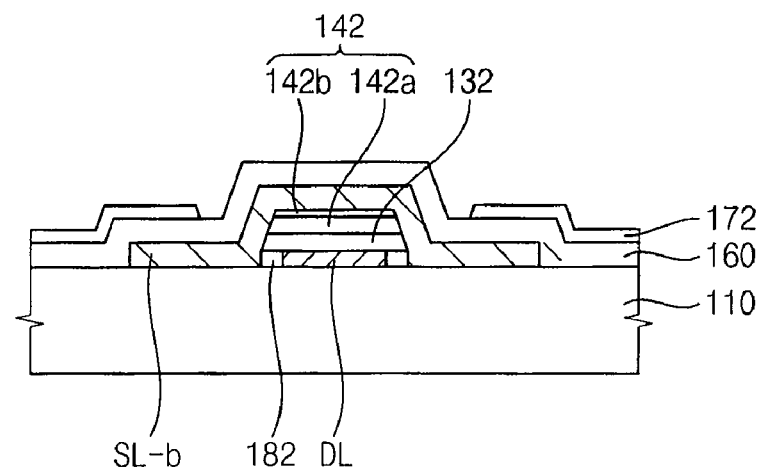
FIG. 6B is a cross-sectional view taken along a line V-V' shown in FIG. 5.
Figure 6C:
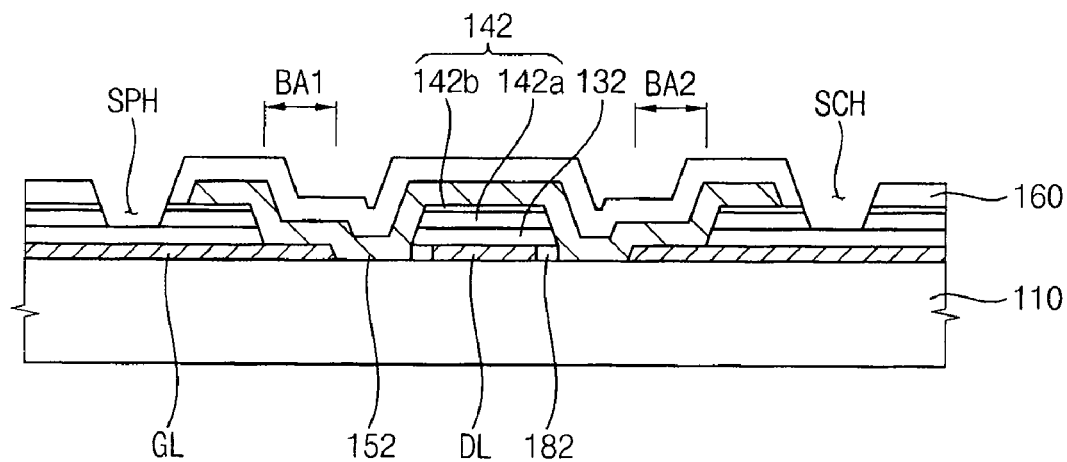
FIG. 6C is a cross-sectional view taken along a line VI-VI' shown in FIG. 5.

FIG. 5 is an enlarged plan view a first substrate employed in a display apparatus in accordance with Embodiment 2 of the present invention. FIG. 6A is a cross-sectional view taken along a line IV-IV' shown in FIG. 5. FIG. 6B is a cross-sectional view taken along a line V-V' shown in FIG. 5. FIG. 6C is a cross-sectional view taken along a line VI-VI' shown in FIG. 5.

Referring to FIGS. 5 to 6C, a first substrate includes a base substrate 110, gate lines GL, data lines DL, line insulation patterns 132, space-filling insulation patterns 182, semiconductor patterns 142, TFTs, storage lines SL, bridge lines 152, a passivation layer 160, and pixel electrodes 172. Each of the TFTs includes a gate electrode GE, a source electrode SE and a drain electrode DE.

The base substrate 110 may have a plate shape. The base substrate 110 may include a transparent material. The base substrate 110 may include a display region displaying an image and a peripheral region surrounding the display region. The unit pixels arranged in a matrix configuration may be disposed in the display region.

The gate lines GL are formed on the base substrate 110. The gate lines GL extend in a first direction DI1 and are arranged parallel to one another along a second direction different from the first direction DI2. For example, the second direction DI2 may be substantially perpendicular to the first direction DI1.

The data lines DL are also formed on the base substrate 110. The data lines DL are separated from the gate lines GL. The data lines DL extend in the second direction DI2 and are arranged parallel to one another along the first direction DI1. The gate lines GL are respectively divided into two portions by each of the data lines DL. Each data line DL may include data contact parts DL-a formed in unit pixels.

An end of each gate line GL is connected to a gate pad GP and an end of each data line DL is connected to a data pad DP. The gate pad GP and the data pad DP are formed in the peripheral region of the base substrate 110.

The gate electrode GE of the TFT is electrically connected to the gate line GL. For example, the gate electrode GE may be formed on the base substrate 110 and extend from the gate line GL in the second direction to be disposed in the unit pixel.

The line insulation patterns 132 are formed on the gate lines GL, the data lines DL and the gate electrodes GE. The line insulation patterns 132 may cover the gate lines GL, the data lines DL and the gate electrode GE so that spaces respectively adjacent to the gate lines GL, the data lines DL and the gate electrodes GE may be formed between the line insulation patterns 132 and the base substrate 110.

The space-filling insulation patterns 182 are formed in the spaces formed between the line insulation patterns 132 and the base substrate 110. The space-filling insulation patterns 182 may be formed adjacent to the gate lines GL, the data lines DL and the gate electrodes GE.

The line insulation patterns 132 expose the data lines DL in the data contact regions DA. The line insulation patterns 132 may expose the data contact parts DL-a. The line insulation patterns 132 may further expose the gate lines GL in the first and second bridge contact regions BA1 and BA2.

The semiconductor patterns 142 may have a size substantially the same as the line insulation patterns 132. The semiconductor patterns 142 are formed on the line insulation patterns 132. Each of the semiconductor patterns 142 include an active pattern 142a and an ohmic contact pattern 142b formed on the active pattern 142a.

The source electrodes SE and the drain electrodes DE are formed on the base substrate 110 to cover portions of the semiconductor patterns 142.

The source electrode SE is formed in the unit pixel. The source electrode SE may cover a portion of the semiconductor pattern 142 corresponding to the gate electrode GE. The drain electrode DE is separated from the source electrode SE and formed in the unit pixel. The drain electrode DE may cover another portion of the semiconductor pattern 142.

Each of the storage lines SL may include a horizontal storage part SL-a and a vertical storage part SL-b.

The horizontal storage part SL-a is formed on the base substrate 110 and extending the first direction DI1. The vertical storage part SL-b is formed on the base substrate 110 to cover a portion of the semiconductor pattern 142.

The vertical storage part SL-b extends from the horizontal storage part SL-a in the second direction DI2 to cover the data line DL. When viewed in a direction substantially perpendicular to a longitudinal direction of the data line DL as shown in FIG. 6B, the vertical storage part SL-b may entirely cover the data line DL.

The vertical storage part SL-b may wider than the semiconductor pattern 142 formed on the data line DL. The semiconductor pattern 142 formed on the data line DL may be wider than the data line DL. For example, the data line DL may extend along a central portion of the width of the vertical storage part SL-b.

Because the vertical storage part SL-b cover the semiconductor pattern 142 formed on the data line DL, a pixel voltage applied to the pixel electrode 172 may not be affected by the semiconductor pattern 142 formed on the data line DL.

For example, the semiconductor pattern 142 formed on the data line DL may be changed from a nonconductor to a conductor, when the semiconductor pattern 142 formed on the data line DL receives light from a backlight assembly. Thus, the semiconductor pattern 142 changed into the conductor may affect the pixel voltage applied to the pixel electrode 172. However, in embodiments of the present invention, the vertical storage part SL-b covers the semiconductor pattern 142 formed on the data line DL. Thus, the semiconductor pattern 142 covered by the vertical storage part SL-b may not affect the pixel voltage applied to the pixel electrode 172.

The bridge lines 152 are formed on the base substrate 110 to cover portions of the semiconductor patterns 142. Each of the bridge lines 152 electrically connects the two separated portions of the gate line GL with each other. The bridge line 152 may cross the data line DL and make electrical contact with the two portions of the gate line GL in the first and second bridge contact regions BA1 and BA2.

The passivation layer 160 is formed on the base substrate 110 and covers the source electrodes SE, the drain electrodes DE, the storage lines SL, and the bridge lines 152.

The passivation layer 160 includes pixel contact holes 162 to expose drain electrodes DE. The passivation layer 160 may further include gate pad contact holes 164 to expose the gate pads GP and data pad contact holes 166 to expose the data pads DP.

In addition, the passivation layer 160 may further include semiconductor patterning holes SCH. The semiconductor patterning holes SCH may be formed at two adjacent ends of the bridge line 152 with respect to the first direction DI1 and two ends of the bridge line 152 with respect to the second direction DI2. The semiconductor pattern 142 may include separation holes SPH respectively corresponding to the semiconductor patterning holes SCH. To provide regions in which the separation holes SPH are formed, an end portion of the bridge line 152 may be made wider than a center portion of the bridge line 152.

When the separation holes SPH are formed through the semiconductor patterns 142 adjacent to the two ends of the bridge line 152 with respect to the first direction DI1 and the two ends of the bridge line 152 with respect to the second direction DI2, the semiconductor patterns 142 making contact with the bridge line 152 are separated from the semiconductor patterns 142 not making contact with the bridge line 152. Accordingly, the separation holes SPH may prevent the bridge line 152 from being electrically to connected to the data line DL via the semiconductor pattern 142.

The pixel electrodes 172 are formed on the passivation layer 160. The pixel electrodes 172 are electrically connected to the drain electrodes DE, respectively.

Each of the pixel electrodes 172 is formed in the unit pixel to overlap with the horizontal storage part SL-a and the vertical storage part SL-b. In embodiments of the present invention, because the data line DL is disposed under the vertical storage part SL-b to be covered by the vertical storage part SL-b, a parasitic capacitance formed between the pixel electrode 172 and the data line DL may be prevented, regardless of the position of the pixel electrode 172. Therefore, a distance between two adjacent pixel electrodes 172 along the first direction DI1 may be reduced so that the aperture ratio of the display apparatus may be increased.

A gate transparent pad pattern 174 and a data transparent pad pattern 176 may be formed on the passivation layer 160. The gate transparent pad pattern 174 is electrically connected to the gate pad GP through the gate pad contact hole 164 and the data transparent pad pattern 176 is electrically connected to the data pad DP through the data pad contact hole 166.

Hereinafter, a method of manufacturing the first substrate illustrated in FIG. 1 will be described.

FIGS. 7A to 7F are cross-sectional views illustrating a method of manufacturing the first substrate illustrated in FIG. 5.

Referring to FIG. 7A, a lower metal layer 120 is formed on the base substrate 110, and a line insulation layer 130 and a semiconductor layer 140 are sequentially formed on the lower metal layer 120. The semiconductor layer 140 may include an active layer 140a and an ohmic contact layer 140b.

A photoresist layer is formed on the semiconductor layer 140. The photoresist layer is patterned using a mask 10 to form a photoresist pattern 20. The photoresist pattern 20 may include a first photo pattern part 20a and a second photo pattern part 20b that is thinner than the first photo pattern part 20a.

For example, the mask 10 may include a light-transmitting part 12, a light semi-transmitting part 14 and a light-blocking part 16. Light incident on the light-transmitting part 12 passes through the mask 10. Light incident on the light semi-transmitting part 14 partially passes through the mask 10. Light incident on the light-blocking part 16 does not pass through the mask 10. The first photo pattern part 20a corresponds to the light-blocking part 16 and the second photo pattern part 20b corresponds to the light semi-transmitting part 14. The light semi-transmitting part 14 may include a halftone pattern or a slit pattern.

Figure 7B:
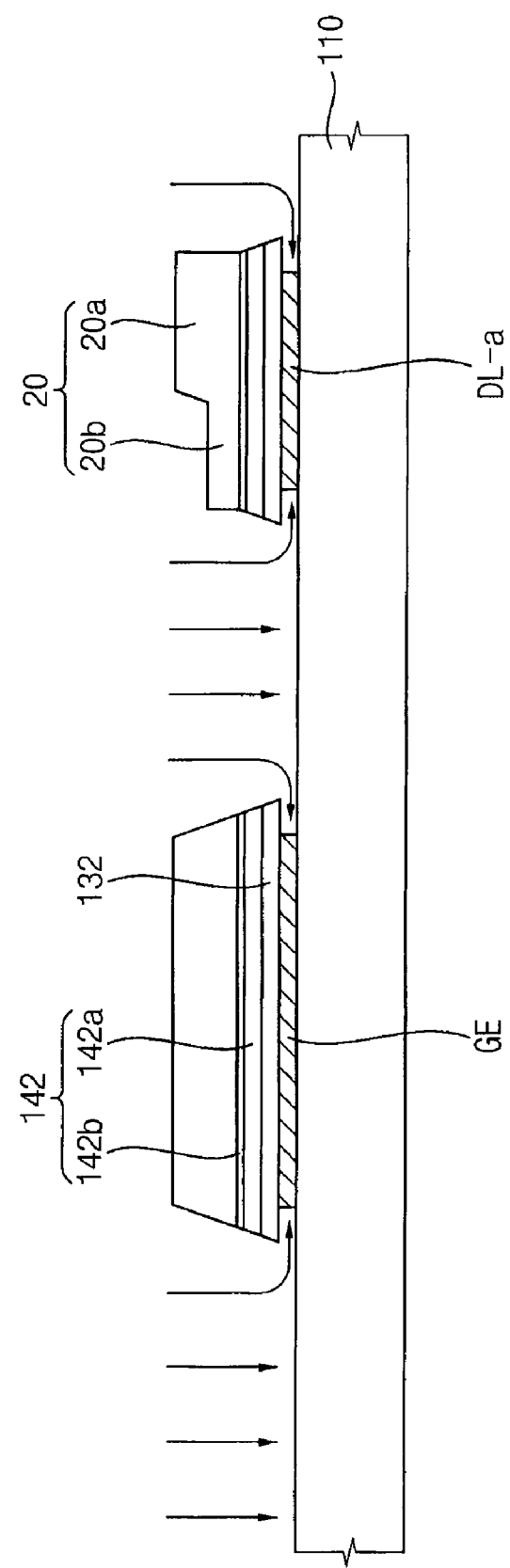

Referring to FIG. 7B, the semiconductor layer 140 and the line insulation layer 130 are patterned using the photoresist pattern 20 to form the semiconductor pattern 142 and the line insulation pattern 132.

The lower metal layer 120 is patterned using the semiconductor pattern 142 and the line insulation pattern 132 to form the lower metal pattern. For example, the lower metal layer may be wet-etched using an etching solution.

The lower metal pattern may include the gate line GL, the data line DL and the gate electrode GE. The lower metal pattern may further include the gate pad GP and the data pad DP.

When the lower metal layer 120 is etched using the etching solution, the lower metal pattern may have an area that is smaller than that of the line insulation pattern 132 and be covered by the line insulation pattern 132. Thus, spaces adjacent to the lower metal pattern may be formed between the line insulation pattern 132 and the base substrate 110.

Referring to FIG. 7C, the thickness of the photoresist pattern 20 is reduced so that the second photo pattern part 20b is removed from the photoresist pattern 20. When the thickness of the photoresist pattern 20 is reduced, the second photo pattern part 20b is removed from the photoresist pattern 20 and the first photo pattern part 20a that remains is made thinner.

The portion of the lower metal pattern that was covered by the second photo pattern part 20b is exposed while the rest remains covered by the first photo pattern part 20a of reduced thickness. For example, the data contact part DL-a in the data contact region DA, a portion of the gate line GL in the first bridge contact region BA1 and another portion of the gate line GL in the second bridge contact region BA2 may be exposed.

Figure 7D:
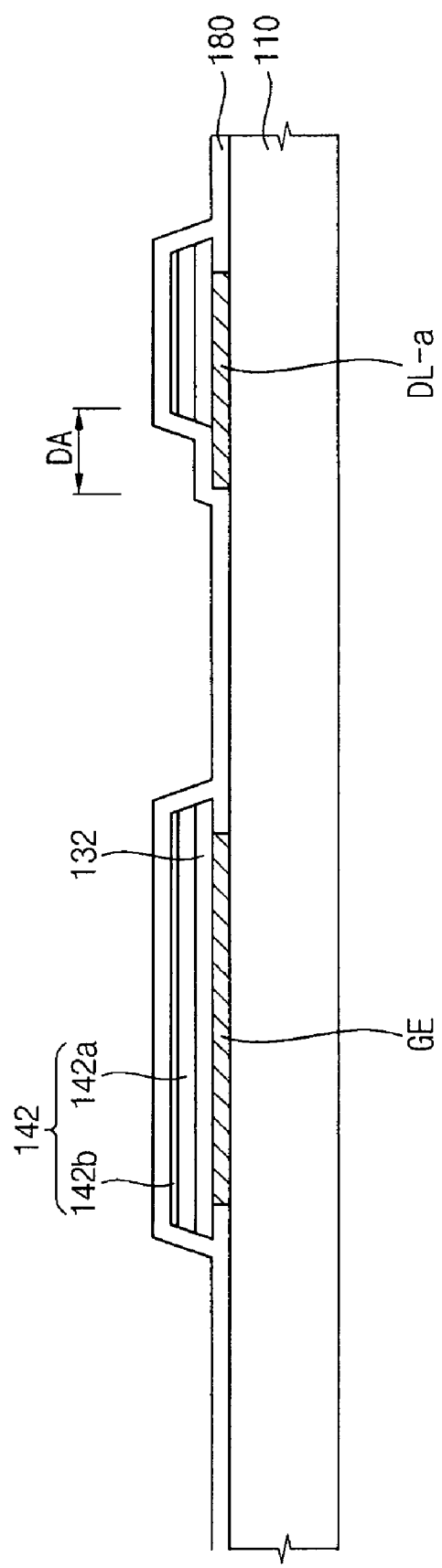

Referring to FIG. 7D, after the photoresist pattern 20 is entirely removed, a sacrificial insulation layer is formed on the base substrate 110 to cover the line insulation pattern 132 and the semiconductor pattern 142. The sacrificial insulation layer fills up the spaces adjacent to the lower metal pattern.

Referring to FIG. 7E, the remaining portion of the sacrificial insulation layer is removed except for a portion of the sacrificial insulation layer filling up the spaces adjacent to the lower metal pattern to form the space-filling insulation pattern 182 filling the spaces adjacent to the lower metal pattern.

Figure 7F:
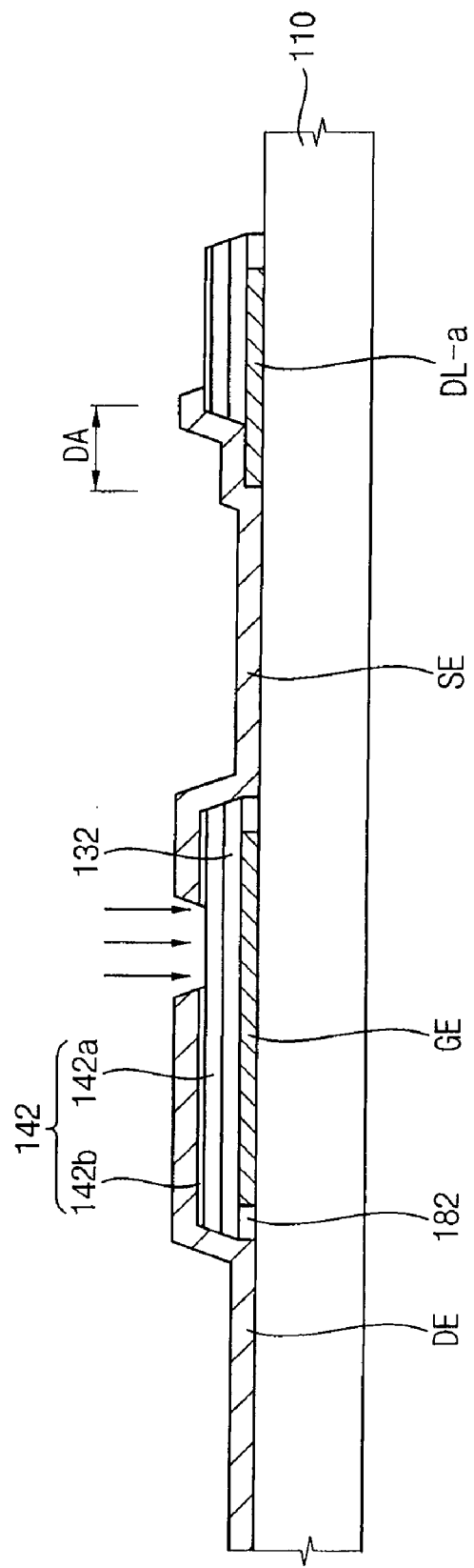

Referring to FIG. 7F, an upper metal layer is formed on the base substrate 110, and then the upper metal layer is patterned to form an upper metal pattern. The upper metal pattern may include the source electrode SE, the drain electrode DE, the storage line SL, and the bridge line 152.

For example, the source electrode SE may make direct contact with a portion of the data line DL, such as the data contact part DL-a, in the data contact region DA and the bridge line 152 may make direct contact with the two portions of the gate line GL separated from each other by the data line DL.

Referring to FIG. 5 and FIGS. 6A to 6C, the passivation layer 160 is formed on the base substrate 110 to cover the upper metal pattern. The passivation layer 160 is partially etched to form the pixel contact hole 162 and the semiconductor patterning holes SCH. The passivation layer 160 may be partially etched to further form the gate pad contact hole 164 corresponding to the gate pad GP and the data pad contact hole 166 corresponding to the data pad DP.

In embodiments of the present invention, the pixel contact hole 162 may be formed in a position corresponding to the drain electrode DE. The semiconductor patterning holes SCH may be formed adjacent to two ends of the bridge line 152 with respect to the first direction DI1 and two ends of the bridge line 152 with respect to the second direction DI2.

The semiconductor pattern 142 is etched using the semiconductor patterning holes SCH to form the separation holes SPH.

A transparent metal layer is formed on the passivation layer 160. The transparent metal layer is patterned to form a transparent metal pattern. The transparent metal pattern may include the pixel electrode 172. The transparent metal pattern may further include the gate transparent pad pattern 174 making contact with the gate pad GP and the data transparent pad pattern 176 making contact with the data pad DP.

The pixel electrode 172 may be electrically connected to the drain electrode DE through the pixel contact hole SPH formed through the passivation layer 160.

FIG. 8 is an enlarged plan view illustrating a portion of a first substrate employed in a display apparatus in accordance with Embodiment 3 of the present invention.

In Embodiment 3 of the present invention, components of the first substrate except for the gate lines, the data lines and the bridge lines are similar to or substantially the same as the components of the first substrate employed in the display apparatus in accordance with Embodiment 1 of the present invention. Thus, any repetitive explanation will be omitted.

Referring to FIG. 8, the gate lines GL are formed on the base substrate 110. The gate lines GL extend in a first direction DI1 and are arranged parallel to one another along a second direction different from the first direction DI2. For example, the second direction DI2 may be substantially perpendicular to the first direction DI1.

The data lines DL are also formed on the base substrate 110. The data lines DL are separated from the gate lines GL. The data lines DL extend in the second direction DI2 and are arranged parallel to one another along the first direction DI1.

The data lines DL are respectively divided into two portions by each of the gate lines GL. For example, each of the data lines DL is divided into two portions separated from each other with respect to one gate line GL.

The bridge lines 152 are formed on the line insulation layer 130. Each of the bridge lines 152 electrically connects the two portions of the data lines DL separated from each other by the gate line GL. For example, the bridge line 152 may cross the gate line GL and make electrical contact with the two portions of the data line DL in the first and second bridge contact regions BA1 and BA2, respectively.

Hereinafter, a method of manufacturing the first substrate illustrated in FIG. 8 will be described.

The method of manufacturing the first substrate illustrated in FIG. 8 is similar to or substantially the same as the method illustrated in FIGS. 4A to 4C, except for some steps for forming the lower metal pattern and the upper metal pattern. For example, the first substrate manufactured by the method described hereinafter may have components that are similar to or substantially the same as the first substrate manufactured by the method illustrated in FIGS. 4A to 4C, except for the shapes of the gate line, the data line and the bridge line. Thus, any repetitive explanation will be omitted.

Referring again to FIG. 8, the lower metal pattern including the gate lines GL, the data lines DL and the gate electrodes GE is formed.

The gate lines GL extend in the first direction DI1 and are arranged parallel to one another along the second direction different from the first direction DI2. The data lines DL are separated from the gate lines GL. The data lines DL extend in the second direction DI2 and are arranged parallel to one another alone the first direction DI1. The data lines DL are respectively divided into two portions by each of the gate lines GL.

The upper metal pattern including the source electrodes SE, the drain electrodes DE, the storage lines SL, and the bridge lines 152 are formed.

The bridge line 152 may cross the gate line GL and make electrical contact with the two portions of the data line DL through the first bridge contact hole formed through the line insulation layer 130 corresponding to the first bridge contact region BA1 and the second bridge contact hole formed through the line insulation layer 130 corresponding to the second bridge contact region BA2, respectively.

FIG. 9 is an enlarged plan view illustrating a portion of a first substrate employed in a display apparatus in accordance with Embodiment 4 of the present invention.

In Embodiment 4 of the present invention, components of the first substrate except for the gate lines, the data lines and the bridge lines are similar to or substantially the same as the components of the first substrate employed in the display apparatus in accordance with Embodiment 2 of the present invention. Thus, any repetitive explanation will be omitted.

Referring to FIG. 9, the gate lines GL are formed on the base substrate 110. The gate lines GL extend in the first direction DI1 and are arranged parallel to one another along the second direction DI2. For example, the second direction DI2 may be substantially perpendicular to the first direction DI1.

The data lines DL are also formed on the base substrate 110. The data lines DL are separated from the gate lines GL. The data lines DL extend in the second direction DI2 and are arranged parallel to one another along the first direction DI1.

The data lines DL are respectively divided into two portions by each of the gate lines GL. For example, each of the data lines DL is divided into two portions separated from each other with respect to a gate line GL.

The bridge lines 152 are formed on the base substrate 110 to cover a portion of the semiconductor patterns 142. Each of the bridge lines 152 electrically connects the two portions of the data lines DL separated from each other by the gate line GL. For example, the bridge line 152 may cross the gate line GL and make electrical contact with the two portions of the data line DL in the first and second bridge contact regions BA1 and BA2, respectively.

Hereinafter, a method of manufacturing the first substrate illustrated in FIG. 9 will be described.

The method of manufacturing the first substrate illustrated in FIG. 9 is similar to or substantially the same as the method illustrated in FIGS. 6A to 6F, except for some steps for forming the lower metal pattern and the upper metal pattern. For example, the first substrate manufactured by the method described hereinafter may have components that are similar to or substantially the same as the first substrate manufactured by the method illustrated in FIGS. 6A to 6F, except for the shapes of the gate line, the data line and the bridge line. Thus, any repetitive explanation will be omitted.

Referring again to FIG. 9, the lower metal pattern including the gate lines GL, the data lines DL and the gate electrodes GE is formed.

The gate lines GL are formed on the base substrate 110. The gate lines GL extend in the first direction DI1 and are arranged parallel to one another along the second direction DI2 different from the first direction DI1. The data lines DL are also formed on the base substrate 110. The data lines DL are separated from the gate lines GL. The data lines DL extend in the second direction DI2 and are arranged parallel to one another along the first direction DI1. The data lines DL are respectively divided into two portions by each of the gate lines GL.

The upper metal pattern including the source electrodes SE, the drain electrodes DE, the storage lines SL, and the bridge lines 152 is formed.

The bridge line 152 may cross the gate line GL and make electrical contact with the two portions of the data line DL in the first and second bridge contact regions BA1 and BA2.

Figure 10:
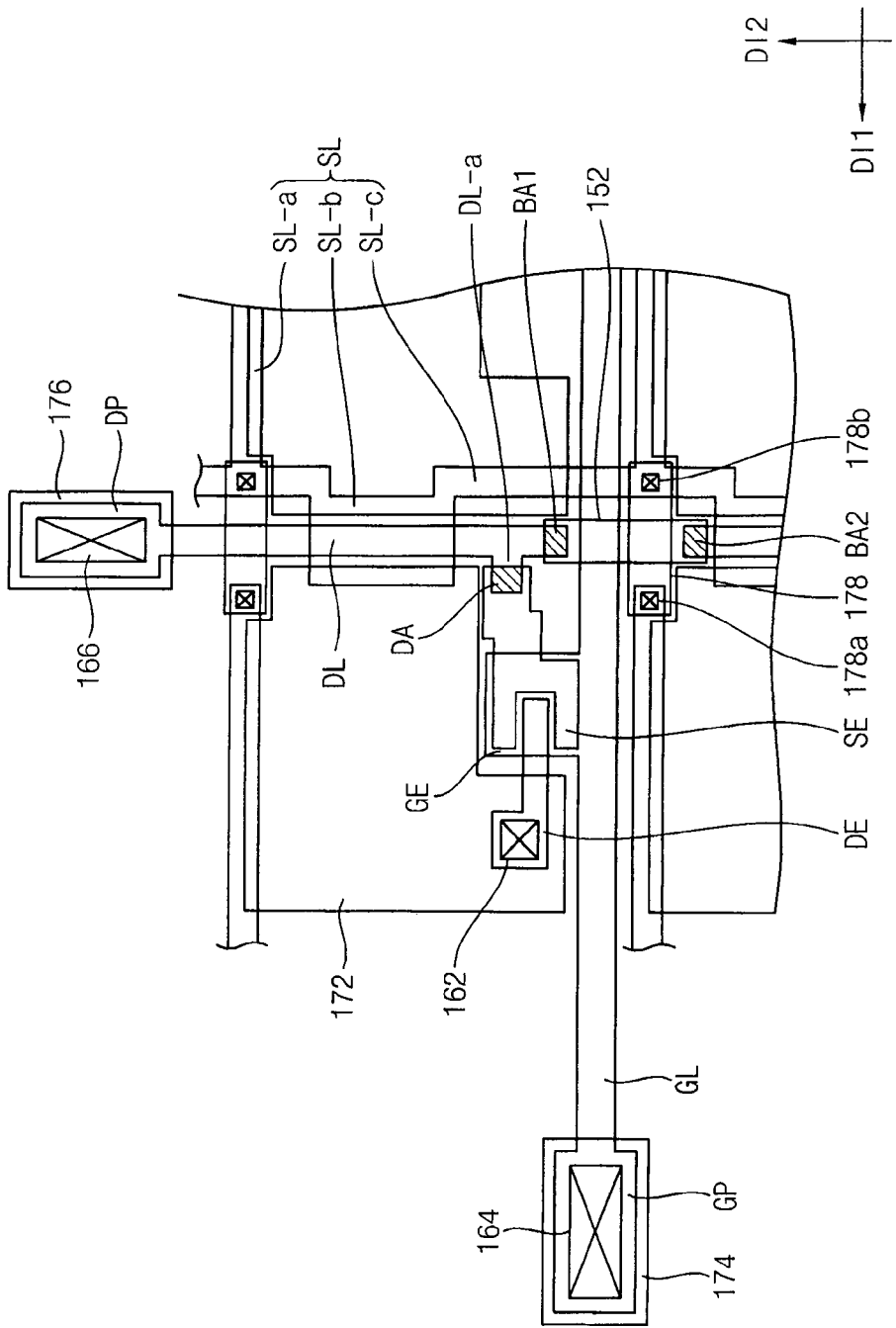
FIG. 10 is an enlarged plan view illustrating a portion of a first substrate employed in a display apparatus in accordance with Embodiment 5 of the present invention.

FIG. 10 is an enlarged plan view illustrating a portion of a first substrate employed in a display apparatus in accordance with Embodiment 5 of the present invention.

In Embodiment 5 of the present invention, components of the first substrate except for the storage line and transparent connection electrodes 178 are similar to or substantially the same as the components of the first substrate employed in the display apparatus in accordance with Embodiment 3 of the present invention. Thus, any repetitive explanation will be omitted.

Referring to FIG. 10, each of the storage lines SL may include a horizontal storage part SL-a and a vertical storage part SL-b. The horizontal storage part SL-a extends in the first direction DI1 to be parallel to the gate line GL. The vertical storage part SL-b extends from the horizontal storage part SL-a in the second direction DI2 to cover the data line DL.

The vertical storage part SL-b may be wider than the data line DL. Thus, when viewed in a direction substantially perpendicular to a longitudinal direction of the data line DL, the vertical storage part SL-b may entirely cover the data line DL.

The horizontal storage part SL-a may be divided into two portions with respect to the data line DL or the bridge line 152.

The transparent connection electrode 178 is formed on the passivation layer 160 and electrically connects the two portions of the horizontal storage part SL-a. For example, the passivation layer 160 may include a first connection contact hole 178a and a second connection contact hole 178b which respectively correspond to the two portions of the horizontal storage part SL-a. The transparent connection electrode 178 may make direct contact with the two portions of the horizontal storage part SL-a through the first and second connection contact holes 178*a* and 178*b* formed through the passivation layer 160 and electrically connect the two portions of the horizontal storage part SL-a.

Each of the storage lines SL may further include a connection storage part SL-c. The connection storage part SL-c may electrically connect two adjacent vertical storage parts SL-b along the second direction DI1.

Hereinafter, a method of manufacturing the first substrate illustrated in FIG. 10 will be described.

The method of manufacturing the first substrate illustrated in FIG. 10 is similar to or substantially the same as the method illustrated in FIGS. 3A to 3C, except for some steps for forming the upper metal pattern, the passivation layer and the transparent metal pattern. For example, the first substrate manufactured by the method described hereinafter may have components that are similar to or substantially the same as the first substrate manufactured by the method illustrated in FIGS. 3A to 3C, except for the storage lines, the passivation layer and the connection transparent electrode. Thus, any repetitive explanation will be omitted.

Referring again to FIG. 10, the upper metal pattern including the source electrodes SE, the drain electrodes DE, the storage lines SL, and the bridge lines 152 is formed.

Each of the storage lines SL may include a horizontal storage part SL-a and a vertical storage part SL-b. The horizontal storage part SL-a extends in the first direction DI1 parallel to the gate line GL. The vertical storage part SL-b extends from the horizontal storage part SL-a in the second direction DI2 to cover the data line DL. The vertical storage part SL-b may be wider than the data line DL. The horizontal storage part SL-a may be divided into two portions with respect to the data line DL or the bridge line 152.

Then, the passivation layer 160 is formed. The pixel contact hole 162 and the first and second connection contact holes 178*a* and 178*b* are formed through the passivation layer 160. The first and second connection contact holes 178*a* and 178*b* are formed in positions corresponding to the two divided portions of the horizontal storage part SL-a, respectively.

Then, the transparent metal pattern including the pixel electrode 172 and the transparent connection electrode 178 is formed.

The transparent connection electrode 178 is formed on the passivation layer 160 and makes electrical contact with the two portions of the horizontal storage part SL-a through the first and second connection contact holes 178*a* and 178*b* so that the two portions of the horizontal storage part SL-a may be electrically connected to each other.

Alternatively, the first substrate and the method illustrated in FIG. 10 may be similar to or substantially the same as the first substrate and the method in accordance with Embodiment 4 of the present invention, except for the storage line and the transparent connection electrode.

Figure 11:
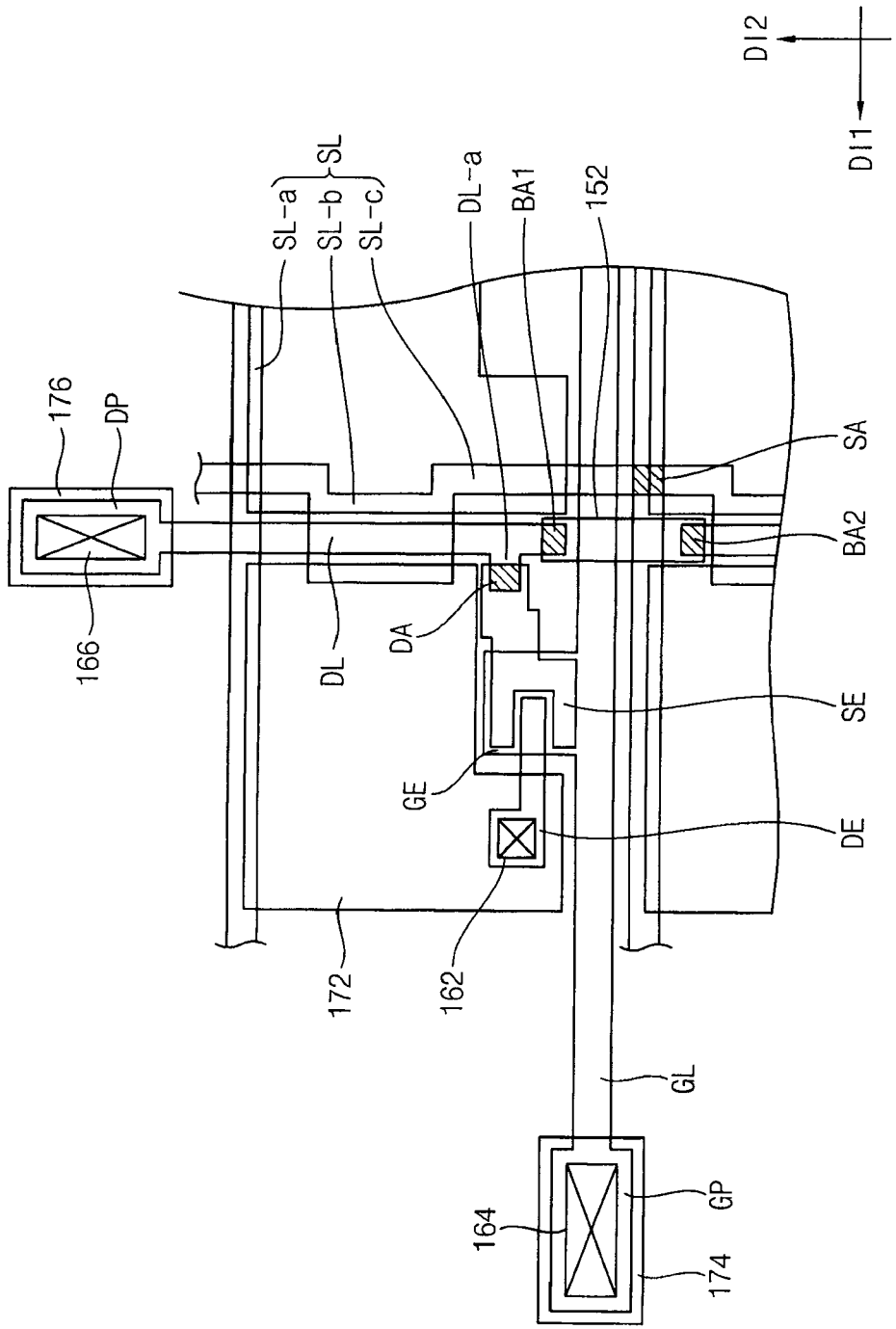
FIG. 11 is an enlarged plan view illustrating a portion of a first substrate employed in a display apparatus in accordance with Embodiment 6 of the present invention.

FIG. 11 is an enlarged plan view illustrating a portion of a first substrate employed in a display apparatus in accordance with Embodiment 6 of the present invention.

In Embodiment 6 of the present invention, components of the first substrate except for the storage line are similar to or substantially the same as the components of the first substrate employed in the display apparatus in accordance with Embodiment 3 of the present invention. Thus, any repetitive explanation will be omitted.

Referring to FIG. 11, each of the storage lines SL may include the horizontal storage part SL-a and the vertical storage part SL-b.

The horizontal storage part SL-a is formed on the base substrate 110. The horizontal storage part SL-a may extend in the first direction parallel to the gate line GL.

The vertical storage part SL-b is formed on the horizontal storage part SL-a. The vertical storage part SL-b extends from the horizontal storage part SL-a in the second direction DI2 to cover the data line DL. The width of the vertical storage part SL-b may be larger than the width of the data line DL. Thus, when viewed in a direction substantially perpendicular to a longitudinal direction of the data line DL, the vertical storage part SL-b may entirely cover the data line DL.

The vertical storage part SL-b may overlap with a portion of the horizontal storage part SL-a. For example, the horizontal storage part SL-a may be exposed in a storage contact region SA and the vertical storage part SL-b partially overlapping with the horizontal storage part SL-a may make direct contact with the horizontal storage part SL-a in the storage contact region SA. Thus, the vertical storage part SL-b may be electrically connected to the horizontal storage part SL-a.

Each of the storage lines SL may further include the connection storage part SL-c. The connection storage part SL-c electrically connects two adjacent vertical storage parts SL-b along the second direction DI2. The connection storage part SL-c may make direct contact with the exposed portion of the horizontal storage part SL-a.

Hereinafter, a method of manufacturing the first substrate illustrated in FIG. 11 will be described.

The method of manufacturing the first substrate illustrated in FIG. 11 is similar to or substantially the same as the method illustrated in FIGS. 3A to 3C, except for some steps for forming the lower metal pattern and the upper metal pattern. For example, the first substrate manufactured by the method described hereinafter may have components that are similar to or substantially the same as the first substrate manufactured by the method illustrated in FIGS. 3A to 3C, except for the storage lines. Thus, any repetitive explanation will be omitted.

Referring again to FIG. 11, the lower metal pattern including the gate lines GL, the data lines DL, the gate electrodes GE, and the horizontal storage part SL-a of the storage line SL is formed.

The horizontal storage part SL-a may be formed on the base substrate 110 and extend in the first direction DI1 parallel to the gate line GL.

The upper metal pattern including the source electrodes SE, the drain electrodes DE, the storage lines SL, the bridge lines 152, and the vertical storage part SL-b of the storage line SL is formed.

The vertical storage part SL-b may be formed on the horizontal storage part SL-a and extend in the second direction DI2 to cover the data line DL. When viewed in a direction substantially perpendicular to a longitudinal direction of the data line DL, the vertical storage part SL-b may entirely cover the data line DL. The vertical storage part SL-b may make direct contact with the exposed portion of the vertical storage part SL-a.

Alternatively, the first substrate and the method illustrated in FIG. 11 may be similar to or substantially the same as the first substrate and the method in accordance with Embodiment 4 of the present invention, except for the storage lines.

According to the embodiments of the present invention, formation of parasitic capacitance between a pixel electrode and a data line may be prevented, regardless of the position of the pixel electrode. The distance between two adjacent pixel electrodes may be reduced, increasing the aperture ratio of a display apparatus, because the data line is disposed under a vertical storage part to be covered by the vertical storage part.

Also, a pixel voltage applied to the pixel electrode may not be affected by a semiconductor pattern corresponding to the data line as much as in a conventional design because the vertical storage part covers the semiconductor pattern corresponding to the data line.

Additionally, a source electrode of a TFT may make direct contact with the data line and a bridge line may make direct contact with two portions of a gate line separated from each other or two portions of the data line separated from each other.

Furthermore, semiconductor patterns making contact with the bridge line may be separated from a semiconductor pattern not making contact with the bridge line by separation holes formed through the semiconductor pattern adjacent to the ends of the bridge line. Thus, the bridge line may be prevented from being electrically connected to the gate line or the data line via the semiconductor pattern.

The foregoing is illustrative of the present disclosure of invention and is not to be construed as limiting thereof. Although a few embodiments of the present disclosure of invention have been described, those skilled in the art will readily appreciate in light of the present teachings that many modifications are possible in the embodiments without materially departing from the novel teachings and advantages of this disclosure. Accordingly, all such modifications are intended to be included within the scope of the present teachings. In the claims, means-plus-function clauses are intended to cover the structures described herein as performing the recited function and not only structural equivalents but also functionally equivalent structures.

What is claimed is:

1. A display substrate comprising:
a base substrate;
a first line formed on the base substrate, the first line extending in a first direction;
a second line formed on a same layer as the first line, the second line extending in a second direction different from the first direction and being divided into two portions with respect to the first line;
a bridge line making contact with the two portions of the second line in a first bridge contact region and a second bridge contact region to electrically connect the two portions of the second line to each other;
a thin-film transistor (TFT) connected to the first and second lines, the TFT including a source electrode making direct contact with one of the first and second lines in a data contact region;
a storage line formed on at least one of the first and second lines making contact with the source electrode, the storage line being insulated from the first line and the second line; and
a pixel electrode overlapping with the storage line, the pixel electrode being electrically connected to the TFT.

2. The display substrate of claim 1, wherein the TFT further comprises:
a gate electrode electrically connected to one of the first and second lines; and
a drain electrode separated from the source electrode, the drain electrode being electrically connected to the pixel electrode.

3. The display substrate of claim 2, wherein the source electrode, the drain electrode, the storage line, and the bridge line are formed by patterning an upper metal layer.

4. The display substrate of claim 3, wherein the first line, the second line and the gate electrode are formed by patterning a lower metal layer.

5. The display substrate of claim 4, further comprising a line insulation layer formed between the lower metal layer and the upper metal layer,
wherein the line insulation layer exposes a portion of at least one of the first line and the second line in the data contact region and portions of the second line in the first and second contact regions.

6. The display substrate of claim 4, further comprising a line insulation layer and a semiconductor pattern formed on the line insulation layer, wherein the line insulation layer and the semiconductor pattern are formed on a lower metal pattern,
wherein the line insulation layer and the semiconductor pattern expose a portion of at least one of the first and second lines in the data contact region and portions of the second line in the first and second bridge contact regions.

7. The display substrate of claim 6, further comprising:
a space-filling insulation pattern formed in a space between the line insulation pattern and the base substrate, the space being adjacent to the lower metal pattern.

8. The display substrate of claim 1, wherein one of the first and second lines is a data line and a remainder of the first and second lines is a gate line.

9. The display substrate of claim 8, wherein the storage line comprises:
a horizontal storage part overlapping with the pixel electrode, the horizontal storage part being substantially parallel to the gate line; and
a vertical storage part extending from the horizontal storage part, the vertical storage part covering the data line and being wider than the data line.

10. The display substrate of claim 9, further comprising a line insulation pattern and a semiconductor pattern formed between the data line and the vertical storage part,
wherein the vertical storage part is wider than the semiconductor pattern and covers the semiconductor pattern.

11. The display substrate of claim 9, further comprising:
a transparent connection electrode electrically connecting two divided portions of the horizontal storage part with respect to the data line with each other, the transparent connection electrode being formed from a transparent metal layer from which the pixel electrode is formed.

12. The display substrate of claim 9, wherein the horizontal storage part is formed from a lower metal layer from which the gate line and the data line are formed, and the vertical storage part is formed on the horizontal storage part to make contact with the horizontal storage part in a storage contact region.

13. A method of manufacturing a display substrate, comprising:
forming a lower metal pattern on a base substrate, the lower metal pattern including a first line extending in a first direction, a second line extending in a second direction different from the first direction, and the second line being divided into two portions with respect to the first line and a gate electrode connected to one of the first and second lines;
forming an upper metal pattern on the lower metal pattern, the upper metal pattern including a source electrode making contact with one of the first and second lines, a drain electrode separated from the source electrode, a storage line formed on one of the first and second lines making contact with the source electrode and overlapping with the one of the first and second lines making contact with the source electrode, and a bridge line making contact with the two portions of the second line; and forming a transparent metal pattern on the upper metal pattern, the transparent metal pattern including a pixel electrode electrically connected to the drain electrode.

14. The method of claim 13, wherein one of the first and second lines is a data line and a remainder of the first and second lines is a gate line.

15. The method of claim 13, wherein forming the lower metal pattern comprises:
    forming a lower metal layer on the base substrate;
    forming a line insulation layer and a semiconductor layer on the lower metal layer, the semiconductor layer being formed on the line insulation layer;
    forming a photoresist pattern on the semiconductor layer, the photoresist pattern including a first photo pattern part and a second photo pattern part that is thinner than the first photo pattern part;
    patterning the semiconductor layer and the line insulation layer using the photoresist pattern to form a semiconductor pattern and a line insulation pattern;
    patterning the lower metal layer using the semiconductor pattern and the line insulation pattern to form a lower metal pattern;
    reducing the photoresist pattern by the thickness of the second photo pattern part such that a portion of the first photo pattern part and none of the second photo pattern part remain; and
    exposing a portion of the lower metal pattern to light.

16. The method of claim 15, wherein patterning the lower metal layer comprises:
    forming a sacrificial insulation layer on the base substrate to cover the line insulation pattern and the semiconductor pattern, the sacrificial insulation layer being formed between the line insulation pattern and the base substrate; and
    removing a portion of the sacrificial insulation layer to form a space-filling insulation pattern, the space-filling insulation pattern filling a space between the line insulation pattern and the base substrate.

17. The method of claim 15, wherein forming the transparent metal pattern comprises:
    forming a passivation layer on the upper metal pattern;
    forming a pixel contact hole corresponding to the drain electrode and semiconductor patterning holes corresponding to ends of the bridge line with respect to the first direction and ends of the bridge line with respect to the second direction through the passivation layer;
    removing a portion of the semiconductor pattern using the semiconductor patterning holes to form separation holes through the semiconductor pattern; and
    forming the transparent metal pattern including the pixel electrode which is electrically connected to the drain electrode through the pixel contact hole on the passivation layer.

18. The method of claim 13, wherein forming the lower metal pattern comprises:
    forming the lower metal pattern on the base substrate;
    forming a line insulation layer covering the lower metal pattern on the base substrate;
    forming a semiconductor layer on the line insulation layer;
    forming a photoresist pattern on the semiconductor layer, the photoresist pattern including a first photo pattern part, a second photo pattern part being thinner than the first photo pattern part, and a photo hole;
    removing a portion of the semiconductor layer and a portion of the line insulation layer using the photo hole of the photoresist pattern to expose a portion of the lower metal pattern;
    reducing a thickness of the photoresist pattern to remove the second photo pattern part from the photoresist pattern; and
    removing a portion of the semiconductor layer using the photoresist pattern having the reduced thickness to form a semiconductor pattern on the gate electrode of the lower metal pattern.

19. A display apparatus, comprising:
    a first substrate comprising:
        a base substrate;
        a first line formed on the base substrate, the first line extending in a first direction;
        a second line formed on the base substrate, the second line extending in a second direction different from the first direction and being divided into two portions with respect to the first line;
        a bridge line making contact with the two portions of the second line in a first bridge contact region and a second bridge contact region to electrically connect the two portions of the second line to each other;
        a TFT formed from a different layer from the first and second lines, the TFT including a source electrode making contact with one of the first and second lines in a data contact region;
        a storage line formed on the one of the first and second lines making contact with the source electrode and overlapping the one of the first and second lines making contact with the source electrode; and
        a pixel electrode formed on the storage line and overlapping the storage line, the pixel electrode being electrically connected to the TFT;
    a second substrate opposite to the first substrate; and
    a liquid crystal layer disposed between the first and second substrates.

* * * * *